United States Patent
Itoh et al.

(10) Patent No.: US 7,504,865 B2
(45) Date of Patent: Mar. 17, 2009

(54) FREQUENCY SENSOR AND SEMICONDUCTOR DEVICE

(75) Inventors: Rie Itoh, Osaka (JP); Eiichi Sadayuki, Osaka (JP)

(73) Assignee: Panasonic Corporation, Osaka (JP)

( * ) Notice: Subject to any disclaimer, the term of this patent is extended or adjusted under 35 U.S.C. 154(b) by 149 days.

(21) Appl. No.: 10/592,427

(22) PCT Filed: Dec. 6, 2004

(86) PCT No.: PCT/JP2004/018146

§ 371 (c)(1),
(2), (4) Date: Sep. 11, 2006

(87) PCT Pub. No.: WO2005/085882

PCT Pub. Date: Sep. 15, 2005

(65) Prior Publication Data
US 2007/0194629 A1 Aug. 23, 2007

(30) Foreign Application Priority Data
Mar. 9, 2004 (JP) ............................. 2004-066055

(51) Int. Cl.
*H03K 9/06* (2006.01)
(52) U.S. Cl. ................. 327/47; 327/31; 327/48; 327/49; 327/18; 327/20; 327/26
(58) Field of Classification Search .................. None
See application file for complete search history.

(56) References Cited

U.S. PATENT DOCUMENTS

| | | | | |
|---|---|---|---|---|
| 5,477,180 A * | 12/1995 | Chen | ........................... | 327/175 |
| 5,602,495 A * | 2/1997 | Lou | ............................. | 326/71 |
| 5,619,155 A | 4/1997 | Wang | ........................... | 327/142 |
| 6,184,715 B1 * | 2/2001 | Catanzaro et al. | ............. | 326/81 |
| 6,310,505 B1 * | 10/2001 | Ogawa et al. | ............... | 327/276 |
| 6,320,470 B1 * | 11/2001 | Arai et al. | ....................... | 331/17 |
| 6,559,677 B2 * | 5/2003 | Nitawaki | ..................... | 326/83 |
| 2002/0017925 A1 * | 2/2002 | Teraishi | ....................... | 327/20 |
| 2003/0225962 A1 | 12/2003 | Hirosawa | ..................... | 711/103 |
| 2004/0199841 A1 * | 10/2004 | Marr | ........................... | 714/731 |

FOREIGN PATENT DOCUMENTS

| | | |
|---|---|---|
| EP | 1 136 830 | 9/2001 |
| JP | 63-72217 | 4/1988 |
| JP | 63-233378 | 9/1988 |
| JP | 1-255044 | 10/1989 |
| JP | 7-55823 | 3/1995 |
| JP | 9-16281 | 1/1997 |
| JP | 2004-54904 | 2/2004 |

* cited by examiner

*Primary Examiner*—Tuan T Lam
*Assistant Examiner*—Hiep Nguyen
(74) *Attorney, Agent, or Firm*—Wenderoth, Lind & Ponack, L.L.P.

(57) ABSTRACT

A frequency sensor includes at least one a resistor element and a capacitor. A frequency is detected according to a charging/discharging time to/from the capacitor, thereby realizing a frequency sensor with reduced power consumption and reduced circuit scale. Further, plural resistors and plural capacitors can be provided, along with switches connected to the respective resistors and capacitors. Additionally, a time constant can be adjusted after production, whereby variations in production can be reduced. Furthermore, a self-diagnosis circuit can be included for determining whether the frequency sensor itself operates normally or not. Thus, a highly-reliable frequency sensor can be realized.

15 Claims, 20 Drawing Sheets

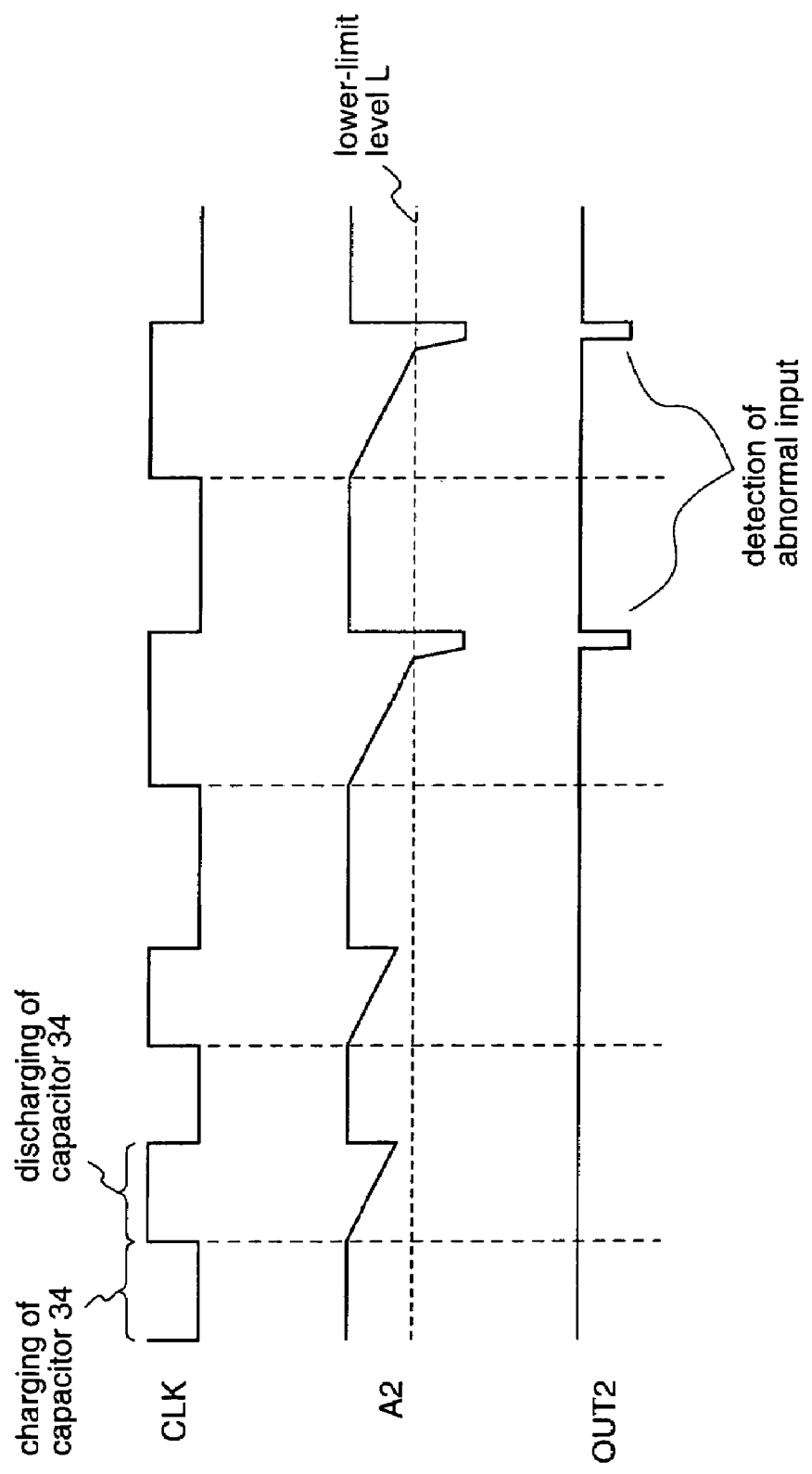

FREQUENCY SENSOR AND SEMICONDUCTOR DEVICE

TECHNICAL FIELD

The present invention relates to a frequency sensor which is usable for preventing illegal analysis of a device that requires high security, such as an IC card, and to a semiconductor device including the sensor.

BACKGROUND ART

In recent years, the progress of semiconductor integrated circuits is remarkable, and data processing functions and data that can be embedded in a chip are dramatically increasing. However, as for a semiconductor device that requires confidentiality of data or the like, such as an IC card equipped with an IC chip, it is important to ensure the security thereof in promoting full-scale spread of this kind of semiconductor device.

To be specific, it is a great threat that this type of LSI for which security is required is operated with a frequency out of an allowable range being inputted to the LSI, and thereby secret information is leaked out. As a countermeasure against such threat, a frequency sensor that detects frequencies of an input clock signal and the like has increasingly become important (for example, refer to Patent Document 1: European Patent No. 1136830 (Pages 2-4, FIGS. 1-4), and Patent Document 2: Japanese Published Patent Application No. Hei. 9-16281 (Pages 5-8, FIGS. 1-2)).

Hereinafter, an example of a conventional frequency sensor will be described.

FIGS. 17 and 18 are diagrams illustrating a conventional frequency sensor and signal waveforms.

In FIG. 17, this frequency sensor includes an edge detection circuit 171, an n-bit counter (n: integer not less than 2) 172, and a state storage unit 173.

A reference clock signal 174 is inputted to the n-bit counter 172 and the state storage unit 173. A clock input signal 175 is inputted to the edge detection circuit 171. Further, an edge detection output signal 176 is outputted from the edge detection circuit 171 to the state storage unit 173. A reset signal 177 is inputted to the edge detection circuit 171, the n-bit counter 172, and the state storage unit 173. A state reset signal 178 is outputted from the n-bit counter 172 to the state storage unit 173.

Hereinafter, a description will be given of the operation of the frequency sensor constituted as described above, with reference to FIGS. 17 and 18.

First of all, when it is assumed that the limit values of the allowable frequency range of a system equipped with this frequency sensor are Fmin and Fmax, the allowable time for one cycle is within Tmin=1/Fmin and larger than Tmax=1/Fmax, that is, the count value of the n-bit counter 172 is within nL and larger than nH (nL>nH).

The edge detection circuit 171 detects rising edges of the clock input signal 175. The n-bit counter 172 is reset by the reset signal 177, and counts up by "1" at each rising edge of the reference clock signal 174. The state storage unit 173 checks whether the count value reaches nL or not, and continues count-up at the rising edges of the reference clock signal 174 when the count value has not yet reached nL. When the count value has reached nL due to the continued count-up, it means that the time for one cycle is larger than Tmin. That is, since the frequency is smaller than Fmin, the n-bit counter 172 outputs a state reset signal 178, whereby the state storage unit 173 outputs a low frequency detection signal LF_Alarm.

When a rising edge of the clock input signal 175 is detected although the count value has not yet reached nL, the state storage unit 173 checks whether the count value is smaller than nH or not. When the count value is larger than nH, it means that the clock input signal 175 is within the allowable frequency range, and the n-bit counter 172 is reset. When the count value is smaller than nH, it means that the clock input signal 175 is higher than the allowable frequency range, and the state storage unit 173 outputs a high frequency detection signal HF_Alarm. Then, the processing is repeated from the first step by the reset signal 177.

As described above, it is detected as to whether the clock input signal is within the allowable frequency range or not, by generating a reference clock and counting the same with the counter.

Setting of detection frequencies is changed by changing the values of nH and nL.

DISCLOSURE OF THE INVENTION

Problems to be Solved by the Invention

In the conventional frequency sensor, however, in order to make setting of detection frequencies that are high frequencies changeable, it is necessary to set the reference clock signal at a frequency sufficiently higher than the frequency of the input clock signal. For example, it is necessary to set the reference clock signal at a frequency ten times as high as the maximum frequency specification of the input clock signal. Such increase in the frequency of the reference clock signal leads to an increase in power consumption. Further, when the frequency of the reference clock is increased, there occurs a necessity of increasing the number of counters for detecting low frequencies, leading to an increase in circuit scale.

The present invention is made to solve the above-described problems and has for its object to provide a frequency sensor having reduced current consumption and reduced circuit scale, and a semiconductor device including such frequency sensor.

Measures to Solve the Problems

So, a frequency sensor of the present invention has a capacitor and a resistor, and performs frequency detection according to a charging/discharging time to/from the capacitor, without using a reference clock signal.

That is, according to claim 1 of the present invention, a frequency sensor includes a first conductivity type first MOS transistor having a gate to which an input clock signal is applied, and a source connected to a first power supply voltage; a second conductivity type second MOS transistor having a gate to which the input clock signal is applied, and a source connected to a second power supply voltage; a resistor connected between drains of the first and second MOS transistors; a capacitor connected between the drain of the first MOS transistor and the second power supply voltage; an inverter having an input terminal connected to the connection node of the capacitor and the resistor; and a second conductivity type third MOS transistor having a gate connected to an output terminal of the inverter, a drain connected to the input terminal of the inverter, and a source connected to the second power supply voltage; wherein the frequency of the input clock signal is detected by an output signal of the inverter.

In the frequency sensor according to claim 1 constituted as described above, the frequency of the input clock signal can be detected without using another signal. Further, change in the terminal signal at the connection node of the capacitor and the resistor is accelerated by the inverter and the third MOS transistor, whereby the time required for the frequency detection can be reduced.

According to claim 2 of the present invention, in the frequency sensor defined in claim 1, a resistor block comprising switch-attached resistors is provided instead of the resistor, and each switch-attached resistor includes a switch for switching the resistor between an enable state and a disable state.

In the frequency sensor according to claim 2 constituted as described above, the resistance value can be adjusted, whereby the time constant can be easily changed.

According to claim 3 of the present invention, in the frequency sensor defined in claim 1, a capacitor block comprising switch-attached capacitors is provided instead of the capacitor, and each switch-attached capacitor includes a switch for switching the capacitor between an enable state and a disable state.

In the frequency sensor according to claim 3 constituted as described above, the capacitance can be adjusted, whereby the time constant can be easily changed.

According to claim 4 of the present invention, in the frequency sensor defined in claim 2, the switches comprise fuses.

In the frequency sensor according to claim 4 constituted as described above, setting of the switches for realizing a desired time constant can be fixed by cutting the fuses.

According to claim 5 of the present invention, in the frequency sensor defined in claim 3, the switches comprise fuses.

In the frequency sensor according to claim 5 constituted as described above, setting of the switches for realizing a desired time constant can be fixed by cutting the fuses.

According to claim 6 of the present invention, in the frequency sensor defined in claim 2, ON/OFF of the switches are set according to data stored in a nonvolatile memory.

In the frequency sensor according to claim 6 constituted as described above, setting of the switches for realizing a desired time constant can be easily changed by changing the data.

According to claim 7 of the present invention, in the frequency sensor defined in claim 3, ON/OFF of the switches are set according to data stored in a nonvolatile memory.

In the frequency sensor according to claim 7 constituted as described above, setting of the switches for realizing a desired time constant can be easily changed by changing the data.

According to claim 8 of the present invention, there are provided two frequency sensors as described in claim 1, and the clock signal is applied to one of the frequency sensors while an inversion signal of the clock signal is applied to the other frequency sensor.

In the frequency sensor according to claim 8 constituted as described above, it is possible to detect that both the "High" period and the "Low" period of the clock signal indicate frequencies higher than the allowable frequency range, or frequencies lower than the allowable frequency range.

According to claim 9 of the present invention, the frequency sensor defined in claim 1 further includes a self-diagnosis unit for checking whether the frequency sensor operates normally or not.

In the frequency sensor according to claim 9 constituted as described above, self diagnosis as to whether the frequency sensor operates normally or not can be carried out.

According to claim 10 of the present invention, in the frequency sensor defined in claim 9, the self-diagnosis unit comprises a high frequency generation circuit for generating a high frequency from the input clock signal, which is provided in the self-diagnosis unit; a switching unit for switching a signal to be inputted to the frequency sensor between the input clock signal and a high frequency clock signal that is outputted from the high frequency generation circuit; and a judgment circuit for detecting a signal detected by the frequency sensor to judge whether the frequency sensor operates normally or not.

In the frequency sensor according to claim 10 constituted as described above, a high frequency signal is generated in the self-diagnosis unit, whereby self diagnosis as to whether the frequency sensor operates normally or not can be carried out.

According to claim 11 of the present invention, in the frequency sensor defined in claim 9, the self-diagnosis unit comprises a low frequency generation circuit for generating a low frequency from the input clock signal, which is provided in the self-diagnosis unit; a switching unit for switching a signal to be inputted to the frequency sensor between the input clock signal and a low frequency clock signal that is outputted from the low frequency generation circuit; and a judgment circuit for detecting a signal detected by the frequency sensor to judge whether the frequency sensor operates normally or not.

In the frequency sensor according to claim 11 constituted as described above, a low frequency signal is generated in the self-diagnosis unit, whereby self diagnosis as to whether the frequency sensor operates normally or not can be carried out.

According to claim 12 of the present invention, a semiconductor device comprises a frequency sensor as defined in claim 1; and a semiconductor device body to which the input clock signal is applied, the operation of which is controlled according to a signal detected by the frequency sensor.

In the semiconductor device according to claim 12 constituted as described above, it is possible to detect the frequency of the clock signal inputted to the semiconductor device.

According to claim 13 of the present invention, in the semiconductor device defined in claim 12, the semiconductor device body is reset by the detected signal.

In the semiconductor device according to claim 13 constituted as described above, the semiconductor device is automatically reset when the clock signal inputted to the semiconductor device deviates from the allowable frequency, whereby the security can be improved.

According to claim 14 of the present invention, in the semiconductor device defined in claim 12, the semiconductor device body stops its operation according to the detected signal.

In the semiconductor device according to claim 14 constituted as described above, the operation thereof is automatically stopped when the clock signal inputted to the semiconductor device deviates from the allowable frequency, whereby the security can be improved.

According claim 15 of the present invention, in the semiconductor device defined in claim 12, the semiconductor device body deletes or destroys stored data for which confidentiality is required, according to the detected signal.

In the semiconductor device according to claim 15 constituted as described above, the data that requires confidentiality is automatically deleted or destroyed when the clock signal inputted to the semiconductor device deviates from the allowable frequency, whereby the security can be improved.

Effects of the Invention

Since the frequency sensor of the present invention is constituted as described above, a frequency sensor having a reduced circuit scale can be realized.

Further, since the frequency sensor includes the switch that can change the time constant after production, it is possible to provide a frequency sensor and a semiconductor device which have less variations in production.

Furthermore, since the frequency sensor includes the self-diagnosis circuit that checks as to whether the frequency sensor itself operates normally or not, it is possible to provide a frequency sensor and a semiconductor device which have high reliabilities.

BRIEF DESCRIPTION OF THE DRAWINGS

FIG. 4 is a diagram illustrating signal timings of a frequency sensor according to the second embodiment of the present invention.

DESCRIPTION OF THE REFERENCE NUMERALS

Figure 1:
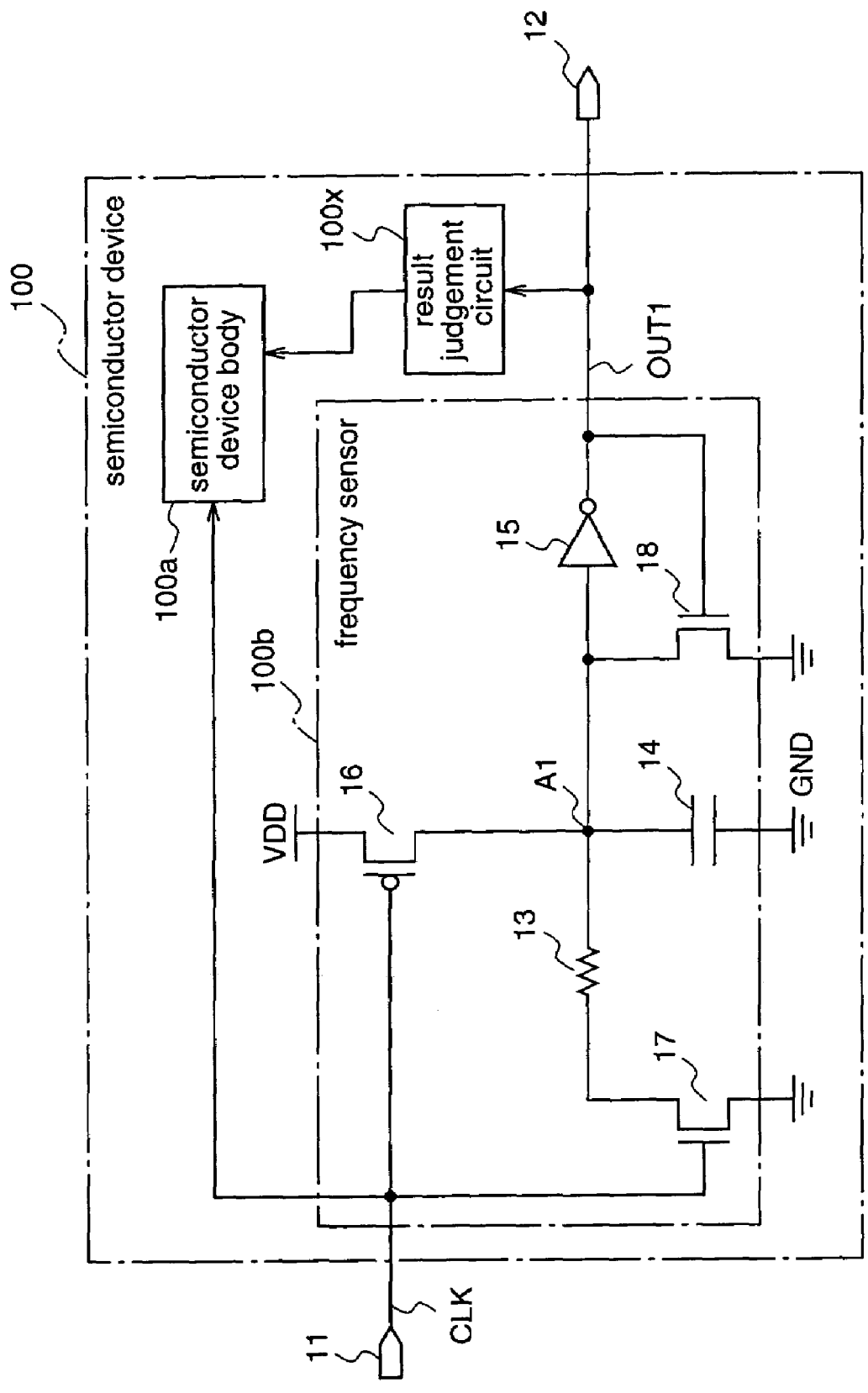
FIG. 1 is a diagram illustrating a semiconductor device having a frequency sensor according to a first embodiment of the present invention.

11 . . . clock signal input terminal
12 . . . high frequency detection signal output terminal
13 . . . resistor element
14 . . . capacitor
15 . . . inverter
16 . . . P channel MOS transistor
17,18 . . . N channel MOS transistor
31 . . . clock signal input terminal
32 . . . low frequency detection signal output terminal
33 . . . resistor element
34 . . . capacitor
35 . . . inverter
36 . . . P channel MOS transistor
37,38 . . . N channel MOS transistor
39 . . . inverter
51 . . . clock signal input terminal
52 . . . high frequency detection signal output terminal
53 . . . resistor block
54 . . . capacitor block
55 . . . inverter
56 . . . P channel MOS transistor
57,58 . . . N channel MOS transistor
100 . . . semiconductor device
100a . . . semiconductor device body
100b, 100c, 100d . . . frequency sensor
100x, 100y . . . result judgment circuit
100a, 103b . . . nonvolatile memory
100a, 103b . . . decoder
103b, 103c, . . .,103n . . . switching signals
104b, 104c, . . .,104n . . . switching signals
121 . . . clock signal input terminal
122 . . . inverter
123 . . . clock inversion signal
124 . . . "High" side high frequency sensor
125 . . . "High" side high frequency detection signal
126 . . . "Low" side high frequency sensor
127 . . . "Low" side high frequency detection signal
128 . . . NAND gate
129 . . . high frequency detection signal output terminal
130 . . . self test circuit
130a . . . high frequency generation circuit
131 . . . clock signal input terminal
132 . . . delay circuit
133,135 . . . inverter
134 . . . NAND gate
136 . . . self test mode signal input terminal
137 . . . selector
138 . . . high frequency sensor
139 . . . result judgment circuit
1310 . . . judgment signal output terminal
144 . . . "High" side low frequency sensor
146 . . . "Low" side low frequency sensor
150 . . . self test circuit
150a . . . low frequency generation circuit
151 . . . clock signal input terminal
152 . . . frequency division circuit
153 . . . self test mode signal input terminal
154 . . . selector
155 . . . low frequency sensor
156 . . . result judgment circuit
157 . . . judgment signal output terminal 200 ... controller
300 ... semiconductor device reader/writer
531,5311a, 5311b, 5311c, ...,5311n ... resistor elements
531a, 531b, 531c, ...,531n ... switch-attached resistor elements
5312a, 5312b, 5312c, ...,5312n ... switches
5411a, 5411b, 5411c, ...,5411n ... capacitors
532,541b, 541c, ...,541n ... switch-attached capacitors
532a, 5412b, 5412c, ...,5412n ... switches
5321a, 5321b, 5321c, ...,5321n ... resistor elements
532a, 532b, 532c, ...,532n ... fuse-attached resistor elements
5422a, 5422b, 5422c, ...,5422n ... fuses
542a, 542b, 542c, ...,542n ... fuse-attached capacitors
5421a, 5421b, 5421c, ...,5421n ... capacitors
533,5331a, 5331b, 5331c, ...,5331n ... resistor elements
533a, 533b, 533c, ...,533n ... switch-attached resistor elements
5332a, 5332b, 5332c, ...,5332n ... switches
543,5431a, 5431b, 5431c, ...,5431n ... capacitors
543a, 543b, 543c, ...,543n ... switch-attached capacitors
5432a, 5432b, 5432c, ...,5432n ... switches
CLK ... clock signal
VDD ... power supply voltage
GND ... ground voltage
OUT1 ... high frequency detection signal
OUT2 ... low frequency detection signal
TEST ... self test mode signal
RESULT ... judgment signal
171 ... edge detection circuit
172 ... n-bit counter
173 ... state storage unit
174 ... reference clock signal
175 ... clock input signal
176 ... edge detection output signal
177 ... reset signal
178 ... state reset signal

BEST MODE TO EXECUTE THE INVENTION

Hereinafter, embodiments of the present invention will be with reference to the drawings.

Embodiment 1

FIG. 1 is a diagram illustrating a semiconductor device containing a frequency sensor according to a first embodiment of the present invention.

In FIG. 1, a semiconductor device 100 includes a semiconductor device body 100a, a frequency sensor 100b, and a result judgment circuit 100x.

The frequency sensor 100b includes a resistor element 13, a capacitor 14, an inverter 15, a P channel MOS transistor 16 serving as a charging part or a first conductivity type first MOS transistor, an N channel MOS transistor 17 serving as a discharging part or a second conductivity type MOS transistor, and an N channel MOS transistor 18 serving as a second conductivity type third MOS transistor.

A clock signal input terminal 11 is a terminal for inputting a clock signal CLK to the semiconductor device 100 for which security is required, such as an IC card. A high frequency detection signal output terminal 12 is a terminal for outputting a high frequency detection signal OUT1 outputted from the frequency sensor 100b. The result judgment circuit 100x judges a case where the high frequency detection signal OUT1 indicates that a clock signal having a frequency higher than that of the original input clock signal is inputted to the semiconductor device, and controls the semiconductor device body 100a.

An output side of the inverter 15 is connected to the high frequency detection signal output terminal 12. An end of the capacitor 14 is grounded. A drain of the P channel MOS transistor 16, an end of the resistor element 13, the other end of the capacitor 14, an input side of the inverter 15, and a drain of the N channel MOS transistor 18 are connected with each other at a point A1 which is a terminal signal node of the capacitor or a connection node of the capacitor and the resistor. Further, the P channel MOS transistor 16 has a source connected to a power supply voltage VDD as a first power supply voltage, and a gate connected to the clock signal input terminal 11. The N channel MOS transistor 17 has a source connected to a ground voltage GND as a second power supply voltage, a drain connected to the other end of the resistor element 13, and a gate connected to the clock signal input terminal 11. The N channel MOS transistor 18 has a source connected to the ground voltage, and a gate connected to the output side of the inverter 15. A clock signal CLK from the clock signal input terminal 11 is inputted to the semiconductor device body 100a.

Hereinafter, a description will be given of the operation of the frequency sensor of the first embodiment constituted as described above, with reference to a timing chart shown in FIG. 2.

When the input clock signal CLK is in a predetermined state "Low", the P channel MOS transistor 16 that functions as a charging part is turned ON while the N channel MOS transistor 17 that functions as a discharging part is turned OFF, whereby the capacitor 14 is charged.

When the clock signal CLK becomes "High" that is an inversion state of the above-mentioned predetermined state, the P channel MOS transistor 16 that functions as a charging part is turned OFF while the N channel MOS transistor 17 that functions as a discharging part is turned ON, whereby the capacitor 14 is discharged. At this time, the voltage at the point A1 gradually drops according to $VDD*\exp(-t/RC)$, wherein R is a value of the resistor element 13, C is a value of the capacitor 14, and * means multiplication. The inverter 15 and the N channel MOS transistor 18 accelerate the voltage drop at the point A1. A lower limit level L is set according to allowed frequencies. This setting is realized by setting the value R of the resistor element 13 and the value C of the capacitor 14.

Figure 2:
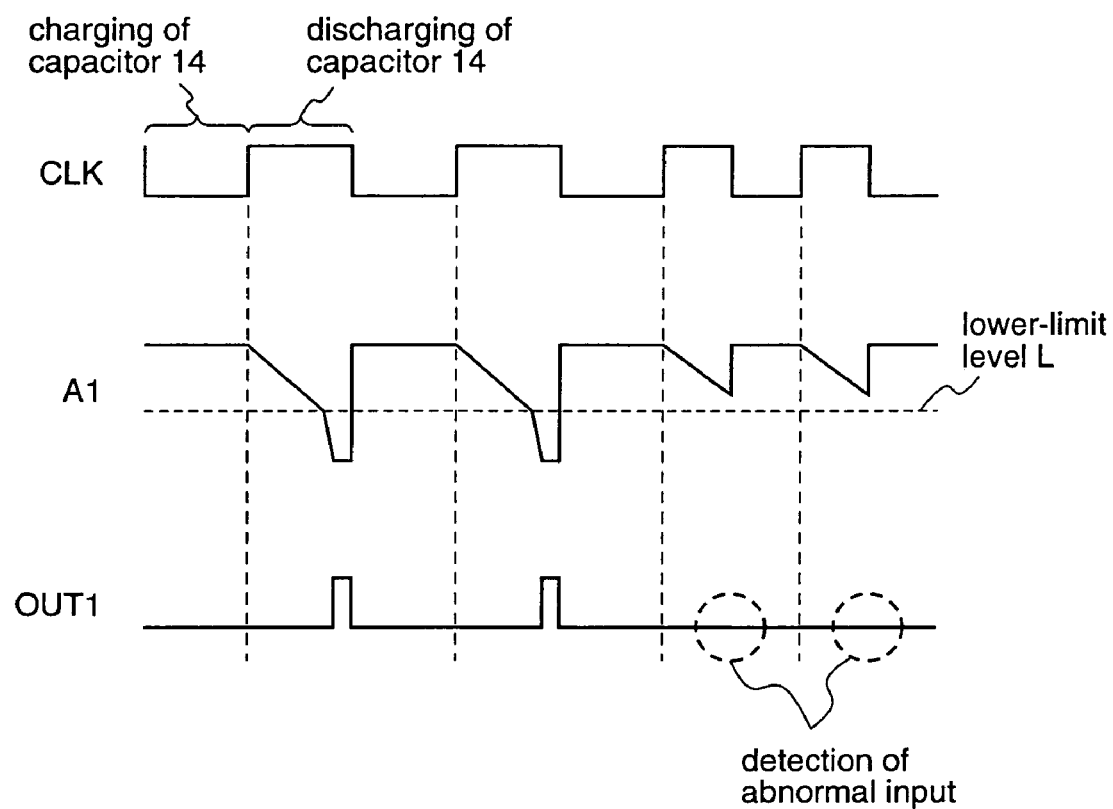
FIG. 2 is a diagram illustrating signal timings of the frequency sensor according to the first embodiment of the present invention.

As shown in FIG. 2, when the clock signal 11 is in the allowed frequency range, the voltage at the point A1 drops beyond the lower limit level L, whereby the high frequency detection signal OUT1 outputs "High" that indicates "normal". When the clock signal 11 is higher than the allowed frequencies, since the voltage at the point A1 does not exceed the lower limit level, "Low" indicating "abnormal" is outputted.

Further, when "Low" is outputted as the high frequency detection signal OUT1, the result judgment circuit 100x judges this signal, and resets the semiconductor device body 100a, or stops the operation thereof, or deletes/destroys the data for which security is required.

As described above, in the frequency sensor according to the first embodiment, when the frequency of the input clock signal CLK is higher than the allowed frequencies, "Low" indicating "abnormal" is outputted from the high frequency detection signal output terminal 12. Thereby, it is possible to detect that a high frequency outside the allowable range is inputted, without using a reference clock signal.

Further, in the semiconductor device according to the first embodiment, when a high-frequency clock signal outside the allowable range is inputted, the result judgment circuit 100x judges this signal, and resets the semiconductor device body 100a, or stops the operation thereof, or deletes/destroys the data for which security is required, thereby realizing a high-security semiconductor device.

Embodiment 2

Figure 3:
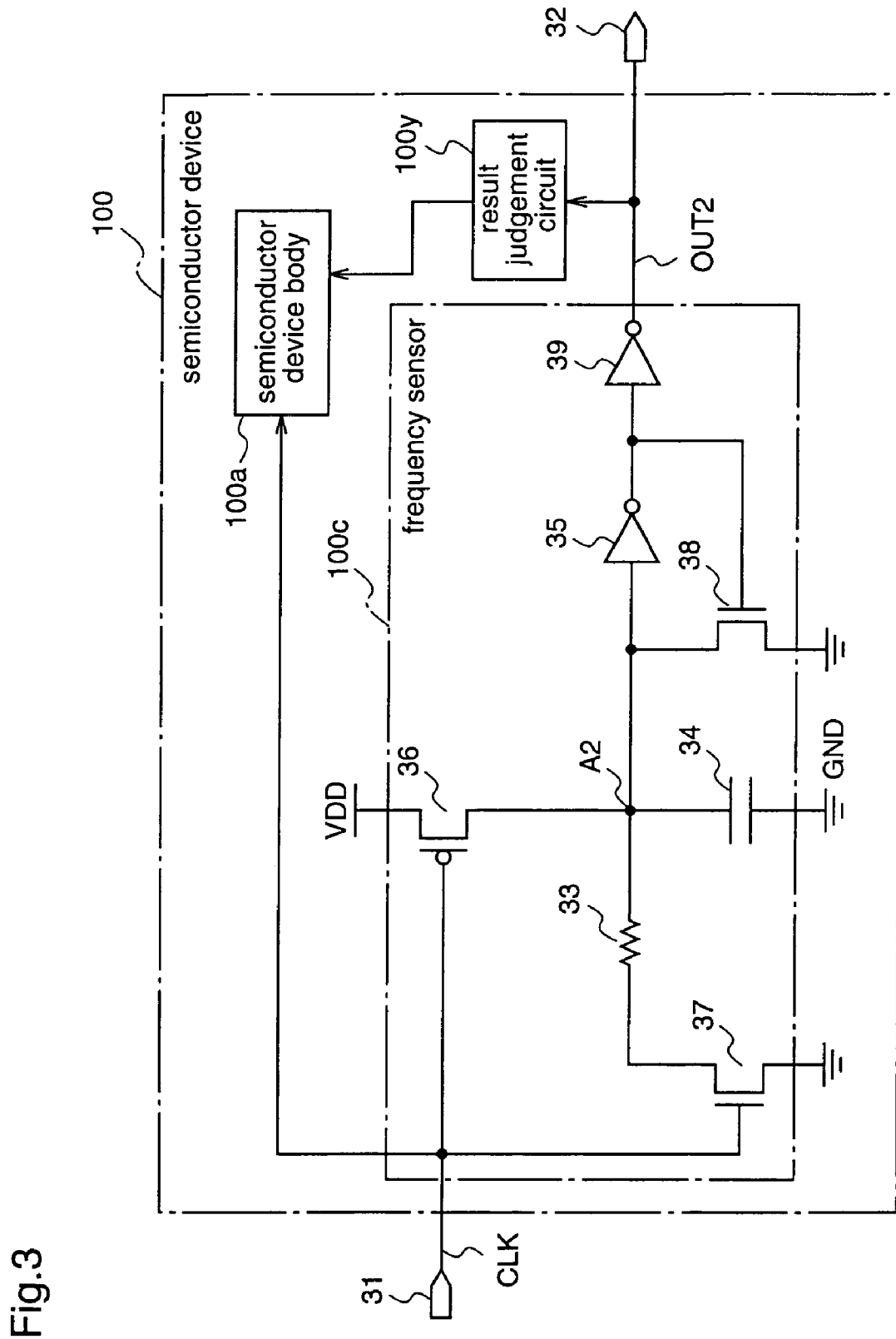
FIG. 3 is a diagram illustrating a semiconductor device having a frequency sensor according to a second embodiment of the present invention.

FIG. 3 is a diagram illustrating a semiconductor device containing a frequency sensor according to a second embodiment of the present invention.

In FIG. 3, a semiconductor device 100 includes a semiconductor device body 100a, a frequency sensor 100c, and a result judgment circuit 100y.

The frequency sensor 100c is obtained by adding an inverter 39 to the same structure as the frequency sensor 100b shown in FIG. 1. That is, the frequency sensor 100c includes a resistor element 33, a capacitor 34, inverters 35 and 39, a P channel MOS transistor 36 serving as a charging part or a first conductivity type first MOS transistor, an N channel MOS transistor 37 serving as a discharging part or a second conductivity type MOS transistor, and an N channel MOS transistor 38 serving as a second conductivity type third MOS transistor.

A clock signal input terminal 31 is a terminal for inputting a clock signal CLK to the semiconductor device 100 for which security is required, such as an IC card. A low frequency detection signal output terminal 32 is a terminal for outputting a low frequency detection signal OUT2 outputted from the frequency sensor 100c. The result judgment circuit 100y judges a case where the low frequency detection signal OUT2 indicates that a clock signal having a frequency lower than that of the original input clock signal is inputted to the semiconductor device, and controls the semiconductor device body 100a.

An output side of the inverter 35 is connected to an input side of the inverter 39. An end of the capacitor 34 is grounded. A drain of the P channel MOS transistor 36, an end of the resistor element 33, the other end of the capacitor 34, an input side of the inverter 35, and a drain of the N channel MOS transistor 38 are connected with each other at a point A2 which is a terminal signal node of the capacitor or a connection node of the capacitor and the resistor. Further, the P channel MOS transistor 36 has a source connected to a power supply voltage VDD as a first power supply voltage, and a gate connected to the clock signal input terminal 31. The N channel MOS transistor 37 has a source connected to a ground voltage GND as a second power supply voltage, a drain connected to the other end of the resistor element 33, and a gate connected to the clock signal input terminal 31. The N channel MOS transistor 38 has a source connected to the ground voltage, and a gate connected to the output side of the inverter 35. Further, an input side of the inverter 39 is connected to the output side of the inverter 35, and an output side thereof is connected to the low frequency detection signal output terminal 32. Further, a clock signal CLK from the clock signal input terminal 31 is inputted to the semiconductor device body 100a.

Hereinafter, a description will be given of the operation of the frequency sensor of the second embodiment constituted as described above, with reference to a timing chart shown in FIG. 4.

When the input clock signal 31 is "Low", the P channel MOS transistor 36 that functions as a charging part is turned on while the N channel MOS transistor 37 that functions as a discharging part is turned off, whereby the capacitor 34 is charged.

When the clock signal 31 becomes "High", the P channel MOS transistor 36 that functions as a charging part is turned off while the N channel MOS transistor 37 that functions as a discharging part is turned on, whereby the capacitor 34 is discharged. At this time, the voltage at the point A2 gradually drops according to VDD*exp(-t/RC), wherein R is a value of the resistor element 33, C is a value of the capacitor 34, and * means multiplication. The inverter 35 and the N channel MOS transistor 38 accelerate the voltage drop. A lower limit level L is set according to the allowed frequencies. This setting is realized by setting the value R of the resistor element 33 and the value C of the capacitor 34.

As shown in FIG. 4, when the clock signal 31 is in the allowed frequency range, the clock input signal 31 of "Low" is inputted to the point A2 before the voltage at the point A2 exceeds the lower-limit level, whereby charging of the capacitor is started. At this time, "High" indicating "normal" is outputted as the low frequency detection signal OUT2. When the clock signal 31 is lower than the allowed frequencies, the voltage at the point A2 exceeds the lower-limit level, whereby "Low" indicating "abnormal" is outputted.

Further, when "Low" is outputted as the low frequency detection signal OUT2, the result judgment circuit 100y judges this, and resets the semiconductor device body 100a, or stops the operation thereof, or deletes/destroys the data for which security is required.

As described above, according to the frequency sensor of the second embodiment, when the input clock signal CLK is lower than the allowed frequencies, "Low" indicating "abnormal" is outputted from the high-frequency detection signal output terminal 32. Thereby, it is possible to detect that a low frequency outside the allowable range is inputted, without using a reference clock signal.

Further, in the semiconductor device according to the second embodiment, when a low-frequency clock signal outside the allowable range is inputted, the result judgment circuit 100y judges this signal, and resets the semiconductor device body 100a, or stops the operation thereof, or deletes/destroys the data for which security is required, thereby realizing a high-security semiconductor device.

Embodiment 3

FIGS. 5(a), 5(b), 6, and 7 are diagrams illustrating a semiconductor device containing a frequency sensor according to a third embodiment of the present invention.

In these figures, a semiconductor device 100 includes a semiconductor device body 100a, a frequency sensor 100d, and a result judgment circuit 100x.

The frequency sensor 100d is obtained by replacing the resistor element 13 and the capacitor 14 in the frequency sensor 100b shown in FIG. 1 with a resistor block 53 and a capacitor block 54, respectively. That is, the frequency sensor 100d comprises a resistor block 53, a capacitor block 54, an inverter 55, a P channel MOS transistor 56 serving as a charging part or a first conductivity type first MOS transistor, an N channel MOS transistor 57 serving as a discharging part or a second conductivity type MOS transistor, and an N channel MOS transistor 58 serving as a second conductivity type third MOS transistor.

A clock signal input terminal 51 is a terminal for inputting a clock signal CLK to the semiconductor device 100 for which security is required, such as an IC card. A high frequency detection signal output terminal 52 is a terminal for outputting a high frequency detection signal OUT1 outputted from the frequency sensor 100. The result judgment circuit 100x judges a case where the high frequency detection signal OUT1 indicates that a clock signal having a frequency higher than that of the original input clock signal is inputted to the semiconductor device, and controls the semiconductor device body 100a.

An output side of the inverter 55 is connected to the high frequency detection signal output terminal 52. An end of the capacitor block 54 is grounded. A drain of the P channel MOS transistor 56, an end of the resistor block 53, the other end of the capacitor block 54, an input side of the inverter 55, and a drain of the P channel MOS transistor are connected with each other at a point A1.

Further, the P channel MOS transistor 56 has a source connected to a power supply voltage VDD as a first power supply voltage, and a gate connected to the clock signal input terminal 51. The N channel MOS transistor 57 has a source connected to a ground voltage GND as a second power supply voltage, a drain connected to the other end of the resistor block 53, and a gate connected to the clock signal input terminal 51. The N channel MOS transistor 58 has a source connected to the ground voltage, and a gate connected to the output side of the inverter 55.

Figure 5A:
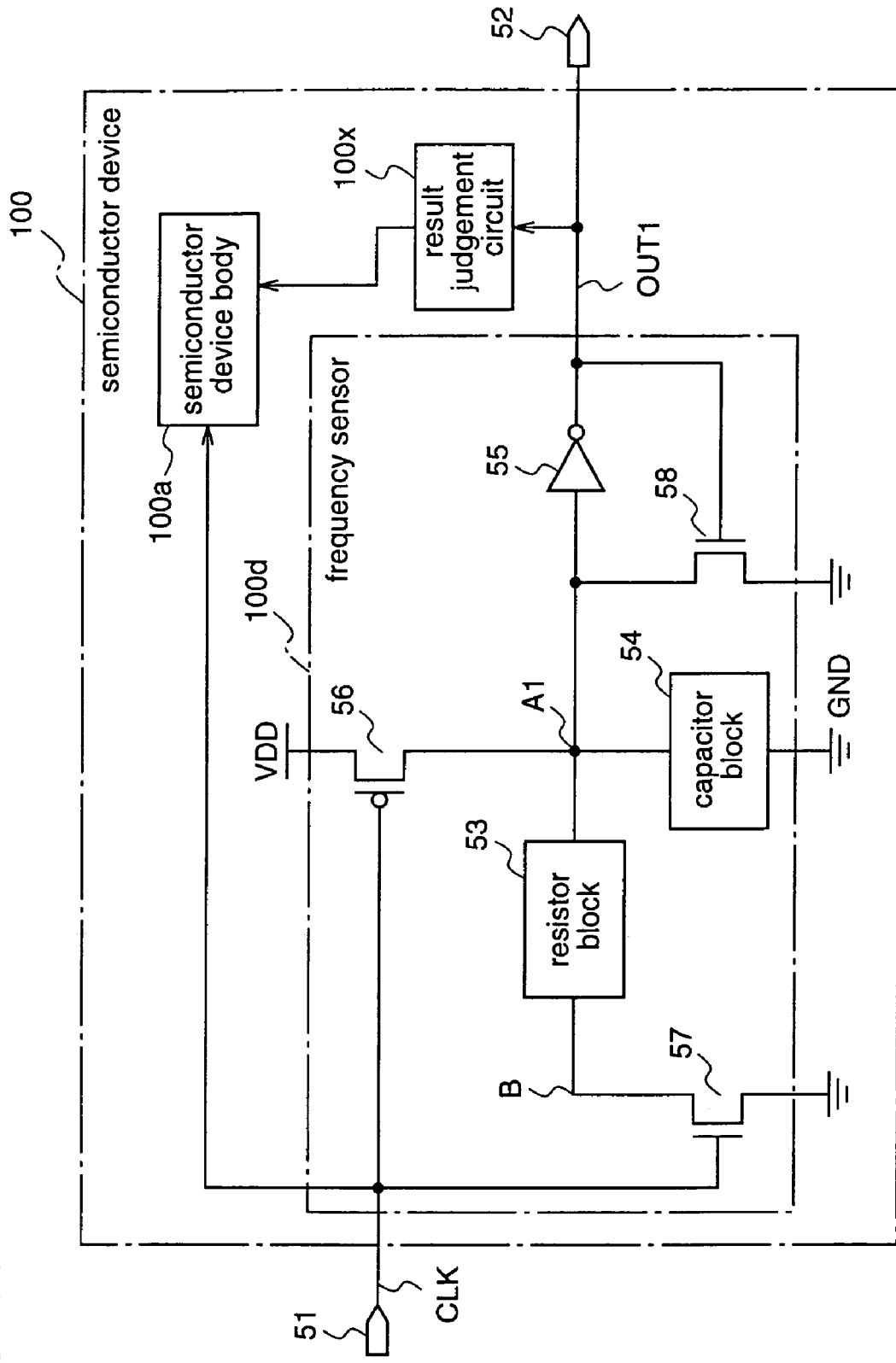
FIG. 5(a) is a diagram illustrating a semiconductor device having a frequency sensor according to a third embodiment of the present invention.
Figure 6:
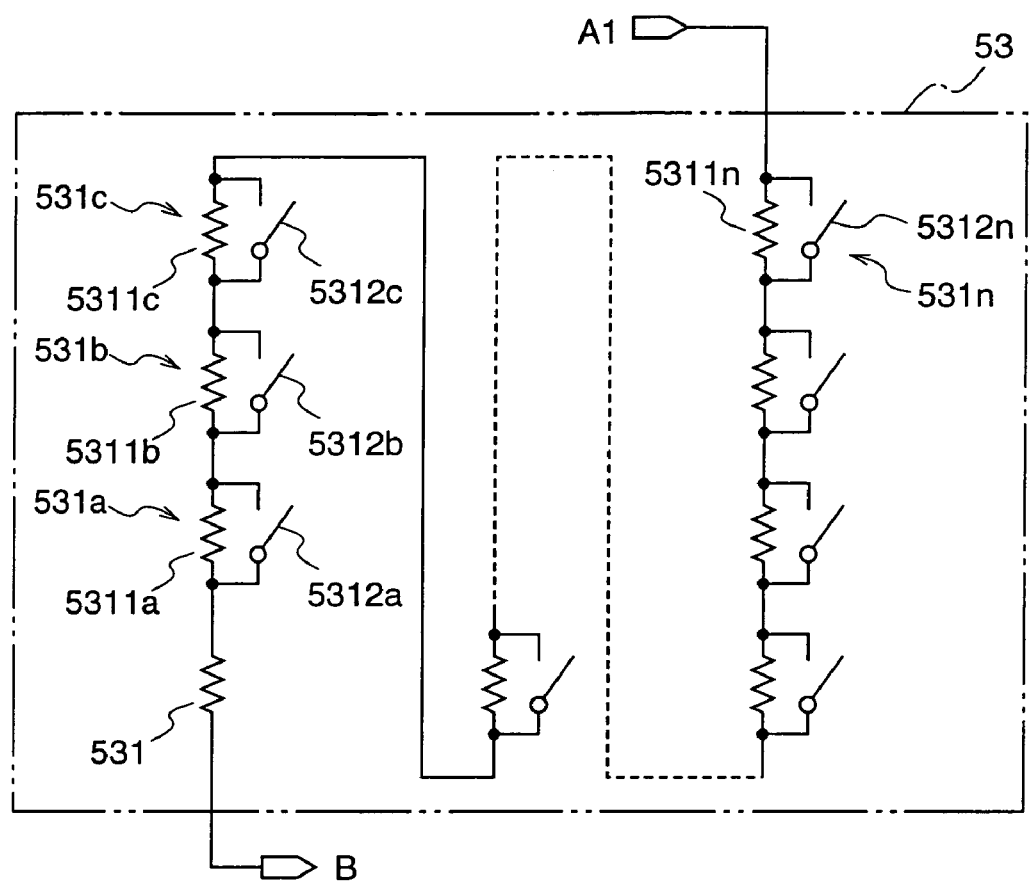
FIG. 6 is a diagram for explaining a resistor block of the frequency sensor according to the third embodiment of the present invention.

FIG. 6 is a diagram illustrating the construction of the resistor block 53 shown in FIG. 5(a). With reference to FIG. 6, in the resistor block 53, switch-attached resistor elements 531a, 531b, 531c, . . ., 531n which are constituted by connecting switches 5312a, 5312b, 5312c, . . ., 5312n at both ends of resistor elements 5311a, 5311b, 5311c, . . ., 5311n, respectively, and a resistor element 531 having no switch are connected in series.

Figure 7:
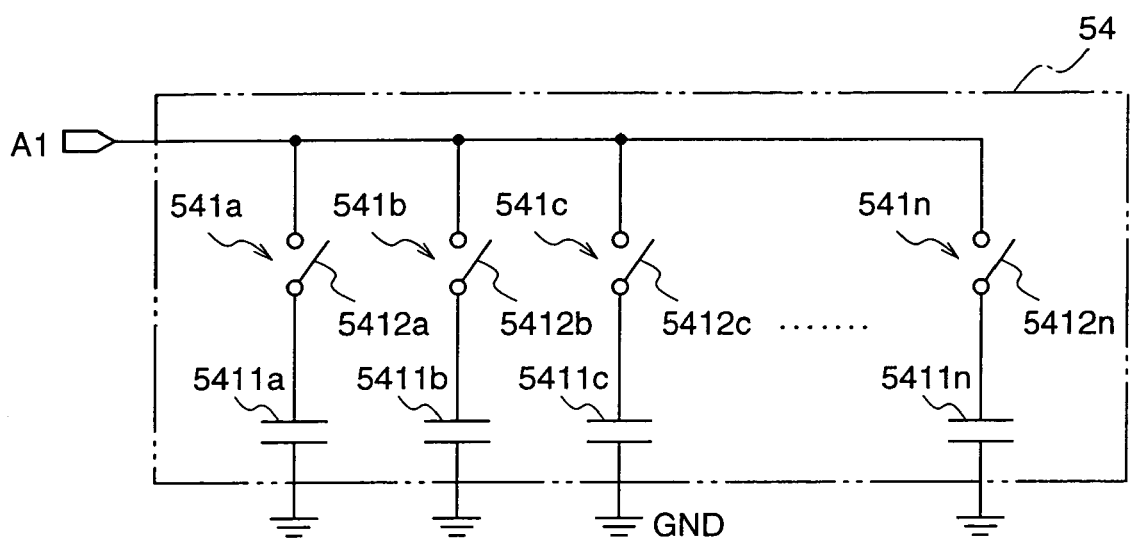
FIG. 7 is a diagram for explaining a capacitor block of the frequency sensor according to the third embodiment of the present invention.

FIG. 7 is a diagram illustrating the construction of the capacitor block 54 shown in FIG. 5(a). With reference to FIG. 7, in the capacitor block 54, switch-attached capacitors 541a, 541b, 541c, . . ., 541n which are constituted by connecting capacitors 5411a, 5411b, 5411c, . . ., 5411n with switches 5412a, 5412b, 5412c, . . ., 5412n respectively in series, are connected in parallel with each other, between the point A1 and the ground voltage GND.

The frequency sensor according to the third embodiment constituted as described above is obtained by replacing the resistor element and the capacitor according to the first or second embodiment with the resistor block and the capacitor block constituted as described above, respectively. Accordingly, the operation of the frequency sensor is identical to that described for the first or second embodiment.

Hereinafter, a description will be given of adjustment of the resistance value of the resistor block and the capacitance value of the capacitor block.

Each of the switch-attached resistor elements 531a, 531b, 531c, . . ., 531n shown in FIG. 6 has a switch for disconnection at both ends of each resistor element, and disconnection or connection of the resistor is selected by turning ON or OFF the switch. The resistor element is disconnected when the switch is ON, and connected when the switch is OFF. The respective switches can be set individually, and the resistor elements can have different resistance values. Thereby, the resistance value of the resistor block 53 is adjustable.

For example, it is assumed that the resistance value of the switch-attached resistor element 531a is 10 kΩ, the resistance value of the resistor element 531b is 5 kΩ, and the resistance values of the resistor elements 531c~531n are respectively 4 kΩ, and all the switches are in their ON states. In this case, in order to increase the resistance value of the entire resistor block, the switches of the resistor elements 531a and 531b are turned OFF.

Further, each of the switch-attached capacitors 541a, 541b, 541c, . . ., 541n has a switch for disconnection at an end of each capacitor, and disconnection/connection of the capacitor can be selected by turning ON or OFF the switch. The capacitor is connected when the switch is ON, and disconnected when the switch is OFF. The respective switches may be set individually, and the respective capacitors may have different values. Thereby, the capacitance of the capacitor block 54 can be adjusted.

For example, it is assumed that the capacitance of the switch-attached capacitor 541a is 15 fF, the capacitance of the switch-attached capacitor 541b is 20 fF, and the capacitances of the switch-attached capacitors 541c~541n are 40 fF, respectively, and all the switches are in their ON states. In this case, in order to decrease the whole capacitance by 35 fF, the switches of the switch-attached capacitors 541a and 541b should be turned OFF.

As described above, in the frequency sensor according to the third embodiment, the time constant can be adjusted after designing by turning ON/OFF the switches of the switch-attached resistor elements 531a, 531b, 531c, . . ., 531n in the resistor block 53 and the switches of the switch-attached capacitors 541a, 541b, 541c, . . ., 541n in the capacitor block 54. Accordingly, in addition to the effects of the first embodiment, it is possible to reduce variations in production of the frequency sensor or a semiconductor device including the frequency sensor.

Figure 5B:
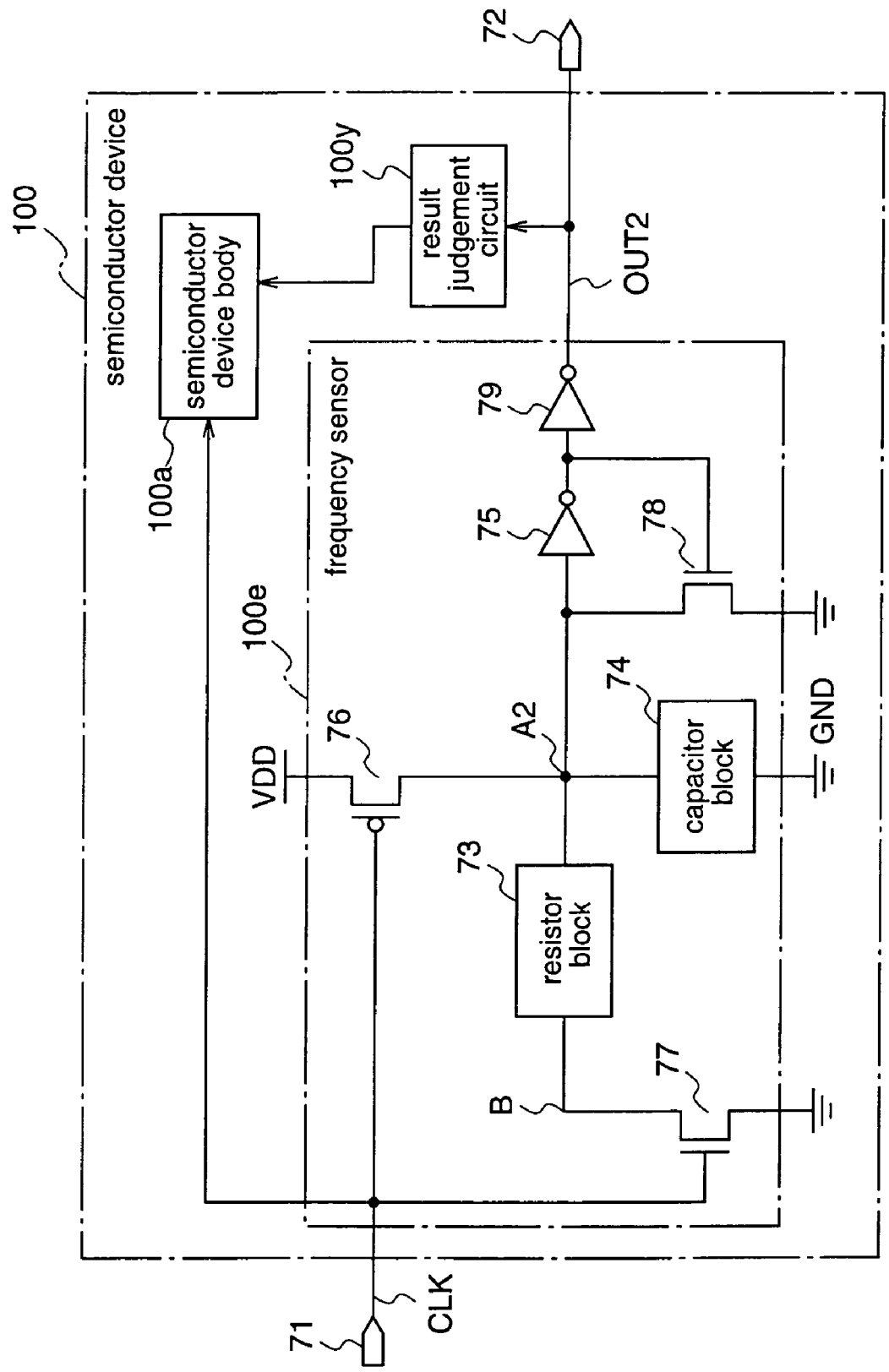
FIG. 5(b) is a diagram illustrating a semiconductor device having a frequency sensor according to the third embodiment of the present invention.

As shown in FIG. 5(b), the resistor element and the capacitor according to the second embodiment may be replaced with a resistor block and a capacitor block, respectively.

In this case, the construction of the frequency sensor is identical to that of the second embodiment except that the numerals in FIG. 5(b) are changed to 70s, and it is possible to reduce variations in production of the frequency sensor and a semiconductor device containing the frequency sensor, in addition to the same effects as those of the second embodiment.

Embodiment 4

Figure 8:
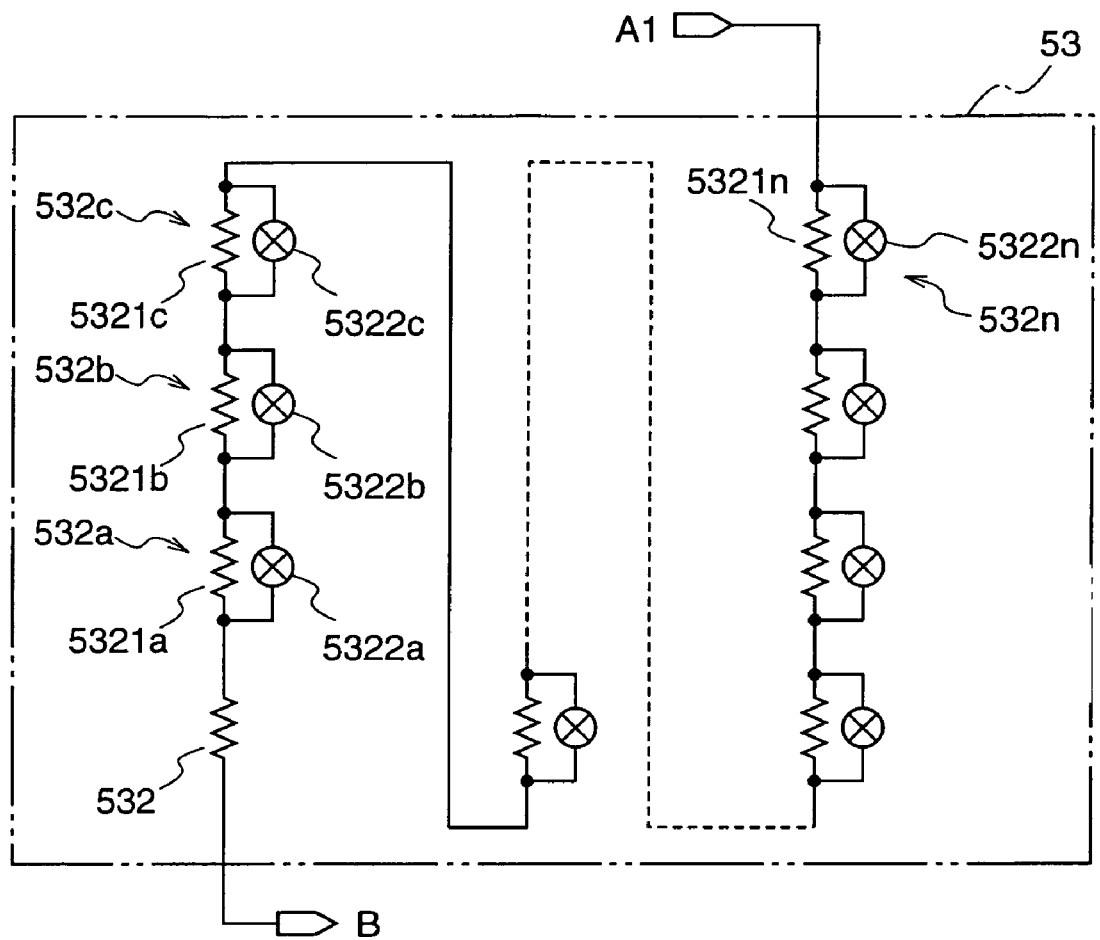
FIG. 8 is a diagram for explaining a resistor block of a frequency sensor according to a fourth embodiment of the present invention.
Figure 9:
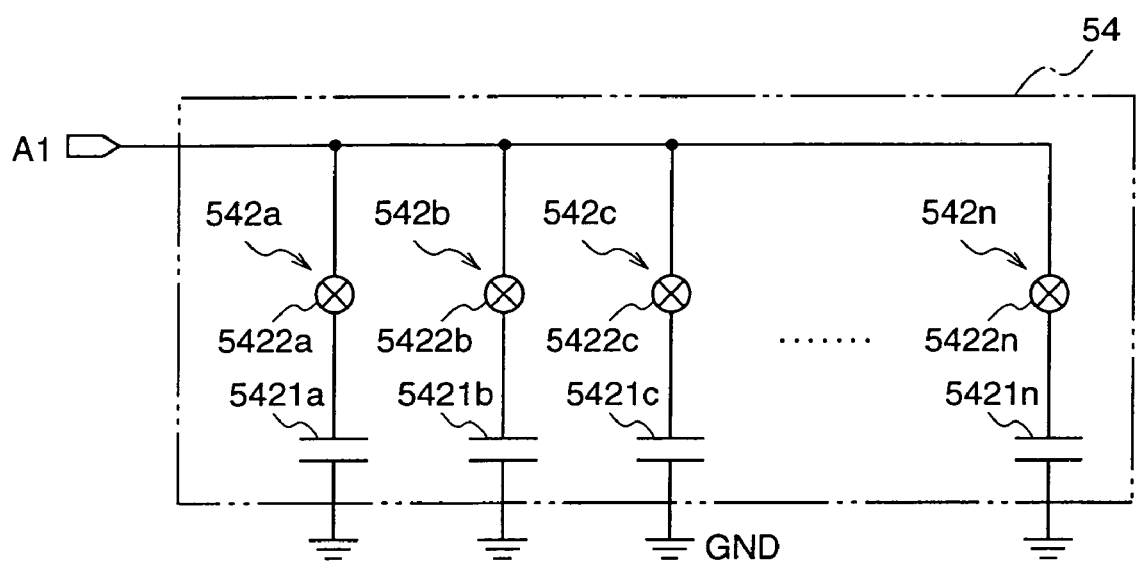
FIG. 9 is a diagram for explaining a capacitor block of the frequency sensor according to the fourth embodiment of the present invention.

FIGS. 8 and 9 are diagrams illustrating the constructions of a resistor block 53 and a capacitor block 54 in a frequency sensor according to a fourth embodiment of the present invention.

In these figures, the resistor block 53 and the capacitor block 54 are obtained by replacing the switch-attached resistor elements and the switch-attached capacitors shown in FIGS. 6 and 7 with fuse-attached resistor elements and fuse-attached capacitors, respectively.

With reference to FIG. 8, in the resistor block 53, fuse-attached resistor elements 532a, 532b, 532c, . . ., 532n which are obtained by connecting fuses 5322a, 5322b, 5322c, . . ., 5322n at both ends of the resistor elements 5321a, 5321b, 5321c, 5321n, respectively, and a resistor element 532 having no fuse are connected in series.

Further, with reference to FIG. 9, in the capacitor block 54, fuse-attached capacitors 542a, 542b, 542c, . . ., 542n which are constituted by connecting capacitors 5421a, 5421b, 5421c, 5421n and fuses 5422a, 5422b, 5422c, . . ., 5422n in series, respectively, are connected in parallel between the point A1 and the ground voltage GND.

The frequency sensor according to the fourth embodiment is obtained by replacing the resistor element and the capacitor according to the first or second embodiment with a resistor block and a capacitor block constructed as mentioned above, respectively. Accordingly, the operation thereof is identical to that described for the first or second embodiment.

Hereinafter, a description will be given of adjustment of a resistance value and a capacitance value of the resistor block and the capacitor block.

Each of the fuse-attached resistor elements 532*a*, 532*b*, 532*c*, . . ., 532*n* shown in FIG. 8 has a fuse connected both ends of each resistor element, and resistive connection is realized by cutting the fuse with a laser cutter or the like according to need. The fuses may be cut individually, and the respective resistor elements may have different resistance values. Thereby, the resistance of the resistor block 53 can be adjusted.

For example, it is assumed that the resistance value of the fuse-attached resistor element 532*a* is 10 kΩ, the resistance value of the fuse-attached resistor element 532*b* is 5 kΩ, and the resistance values of the fuse-attached resistor elements 532*c*~532*n* are respectively 4 kΩ, and all the fuses are in their connected states. In this case, in order to increase the resistance value of the whole resistor block, the fuses of the fuse-attached resistor elements 532*a* and 532*b* should be cut.

Further, in FIG. 9, each of the fuse-attached capacitors 542*a*, 542*b*, 542*c*, . . ., 542*n* has a fuse connected to an end of each capacitor, and the capacitor can be disconnected by cutting the fuse with a laser cutter or the like according to need. The fuses may be cut individually, and the respective capacitors may have different values. Thereby, the capacitance of the capacitor block 54 can be adjusted.

For example, it is assumed that the capacitance of the fuse-attached capacitor 542*a* is 15 fF, the capacitance of the fuse-attached capacitor 542*b* is 20 fF, and the capacitances of the fuse-attached capacitors 542*c*~542*n* are 40 fF, respectively, and all the fuses are in their connected states. In this case, in order to decrease the whole capacitance by 35 fF, the fuses of the fuse-attached capacitors 542*a* and 542*b* should be cut.

As described above, in the frequency sensor according to the fourth embodiment, in addition to the effects of the first and second embodiments, the fuses of the fuse-attached resistor elements 532*a*, 532*b*, 532*c*, . . ., 532*n* are cut when it is desired to increase the time constant, and the fuses of the fuse-attached capacitors 542*a*, 542*b*, 542*c*, . . ., 542*n* are cut when it is desired to decrease the time constant, whereby the time constant can be adjusted after designing, and variations in production of the frequency sensor or a semiconductor device containing the frequency sensor can be reduced.

Embodiment 5

Figure 10:
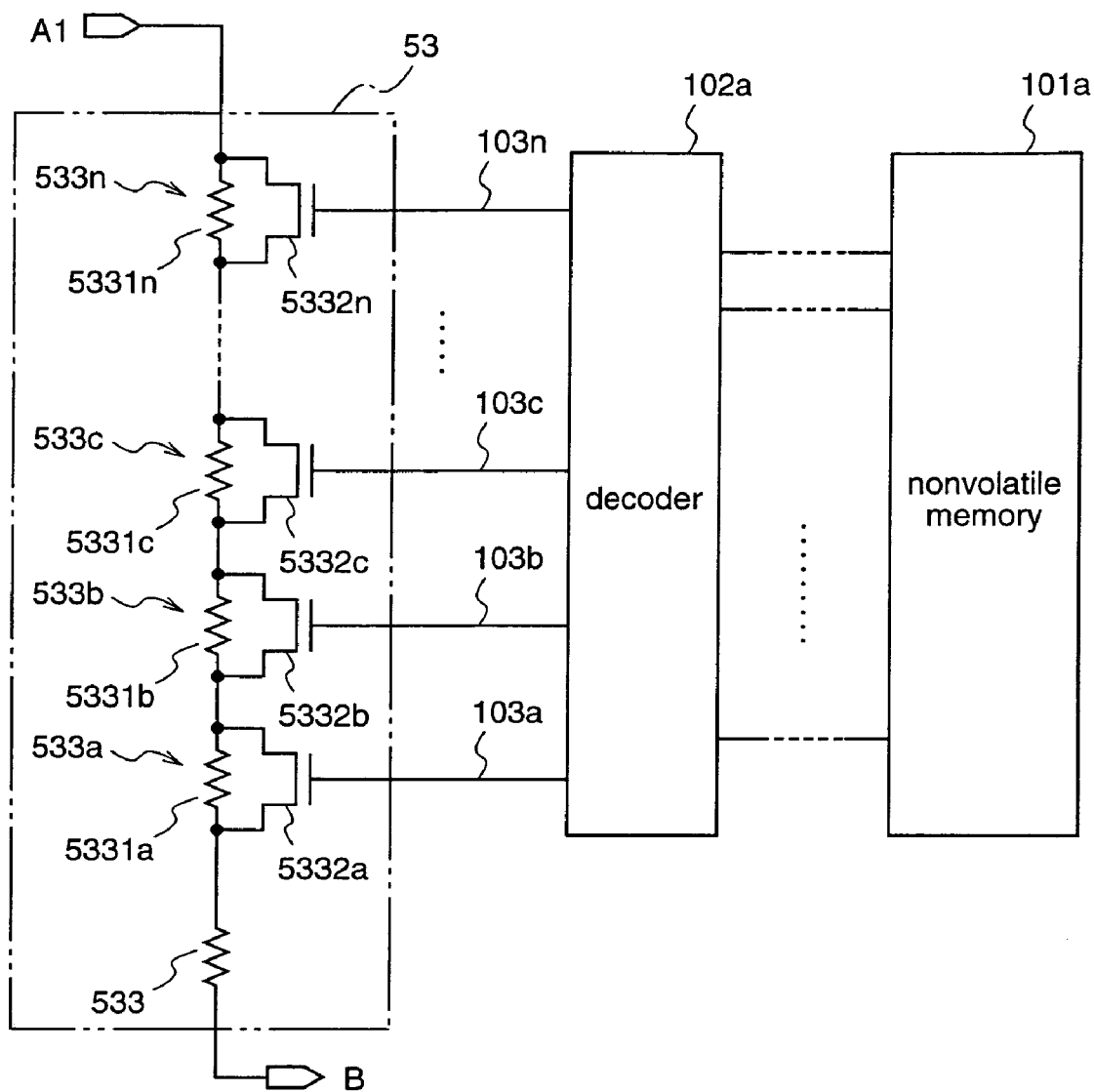
FIG. 10 is a diagram for explaining a resistor block of a frequency sensor according to a fifth embodiment of the present invention.
Figure 11:
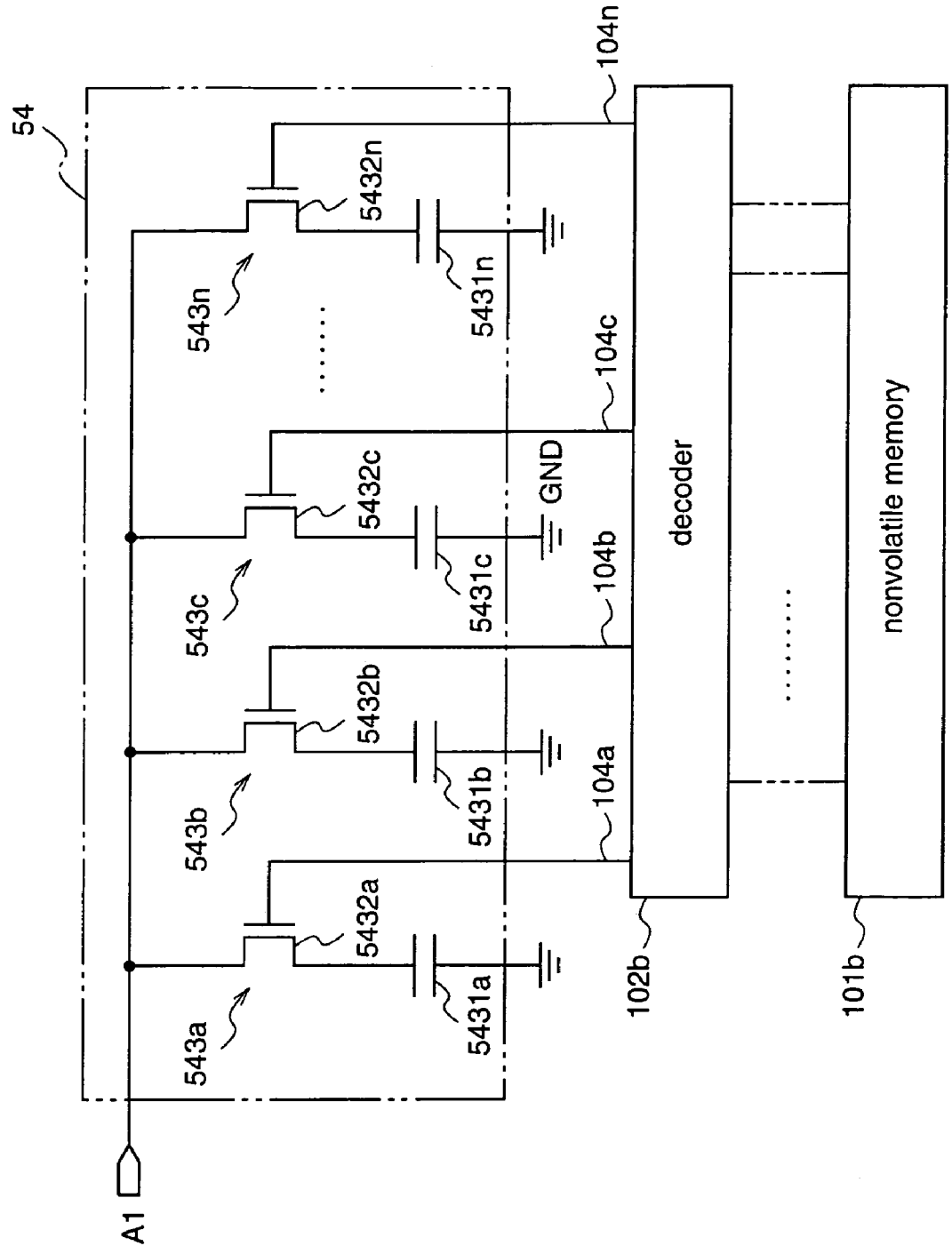
FIG. 11 is a diagram for explaining a capacitor block of the frequency sensor according to the fifth embodiment of the present invention.

FIGS. 10 and 11 are diagrams illustrating a resistor block 53 and a capacitor block 54 of a frequency-sensor according to a fifth embodiment of the present invention.

In these figures, the same constituents as those of the frequency sensor according to the third embodiment are given the same reference numerals. The resistor block 53 and the capacitor block 54 are obtained by replacing the switches of the switch-attached resistor elements and the switch-attached capacitors shown in FIGS. 6 and 7 with transistor switches.

With reference to FIG. 10, in the resistor block 53, switch-attached resistor elements 533*a*, 533*b*, 533*c*, . . ., 533*n* which are obtained by connecting switches 5332*a*, 5332*b*, 5332*c*, . . ., 5332*n* constituted by N channel MOS transistors at both ends of the resistor elements 5331*a*, 5331*b*, 5331*c*, . . . . 5331*n*, respectively, and a resistor element 533 having no switch are connected in series. Further, the switches 5332*a*, 5332*b*, 5332*c*, . . ., 5332*n* are ON/OFF controlled by inputting, to gates of the transistors, a result of decoding of data stored in a nonvolatile memory 101*a* by a decoder 102*a*.

Further, with reference to FIG. 11, in the capacitor block 54, switch-attached capacitors 543*a*, 543*b*, 543*c*, . . ., 543*n* which are constituted by connecting capacitors 5431*a*, 5431*b*, 5431*c*, 5431*n* with switches 5432*a*, 5432*b*, 5432*c*, . . ., 5432*n* in series, respectively, are connected in parallel between the point A1 and the ground voltage GND. Further, the switches 5432*a*, 5432*b*, 5432*c*, . . ., 5432*n* are ON/OFF controlled by inputting, to gates of the transistors, a result of decoding of data stored in a nonvolatile memory 101*b* by a decoder 102*b*.

The frequency sensor according to the fifth embodiment is obtained by replacing the resistor element and the capacitor according to the first or second embodiment with the resistor block and the capacitor block constituted as mentioned above, respectively. Accordingly, the operation of the frequency sensor is identical to that of the first or second embodiment.

Hereinafter, a description will be given of adjustment of a resistance value and a capacitance value of the resistor block and the capacitor block, respectively.

Initially, trimming data for selecting the respective switches of the switch-attached resistor elements 533*a*, 533*b*, 533*c*, . . ., 533*n* shown in FIG. 10 are previously obtained. These values reflect variations after fabrication of the frequency sensor or a semiconductor device containing the frequency sensor, and the data are stored in the nonvolatile memory 101*a*. The trimming data are read from the nonvolatile memory 101*a* and transferred to the decoder 102*a* in such as start-up routine of the semiconductor device. Switch selection signals 103*a*, 103*b*, 103*c*, . . ., 103*n* are outputted from the decoder 102*a*, and each switch is ON when this signal is "High", and it is OFF when this signal is "Low".

Thereby, the resistance value can be adjusted as described for the third embodiment of the present invention. Further, similar adjustment can be carried out with respect to the capacitance shown in FIG. 11.

As described above, in the frequency sensor according to the fifth embodiment, in addition to the effects of the first and second embodiments, the time constant after designing can be adjusted according to the trimming data for selecting the switches of the switch-attached resistor elements 533*a*, 533*b*, 533*c*, . . ., 533*n* in the resistor block 53 and the trimming data for selecting the switches of the switch-attached capacitors 543*a*, 543*b*, 543*c*, . . ., 543*n* in the capacitor block 54, which data are respectively stored in the memory 101*a* and 101*b*, whereby variations in production of a frequency sensor or a semiconductor device containing the frequency sensor can be reduced.

In the fifth embodiment of the present invention, P channel MOS transistors may be employed in place of the N channel MOS transistors. In this case, the switch selection signals 103*a*, 103*b*, 103*c*, . . ., 103*n* and 104*a*, 104*b*, 104*c*, . . ., 104*n* outputted from the decoders are inverted from the signals in the case of using the N channel MOS transistors, whereby similar operation can be realized.

Further, instead of the N channel MOS transistors, bidirectional transfer gates constituted by connecting N channel MOS transistors and P channel MOS transistors in parallel may be used. In this case, the switch selection signal from the decoder is inputted to the gates of the N channel MOS transistors while the inversion signal of the switch selection signal is inputted to the P channel MOS transistors, thereby realizing similar operation.

Embodiment 6

Figure 12A:
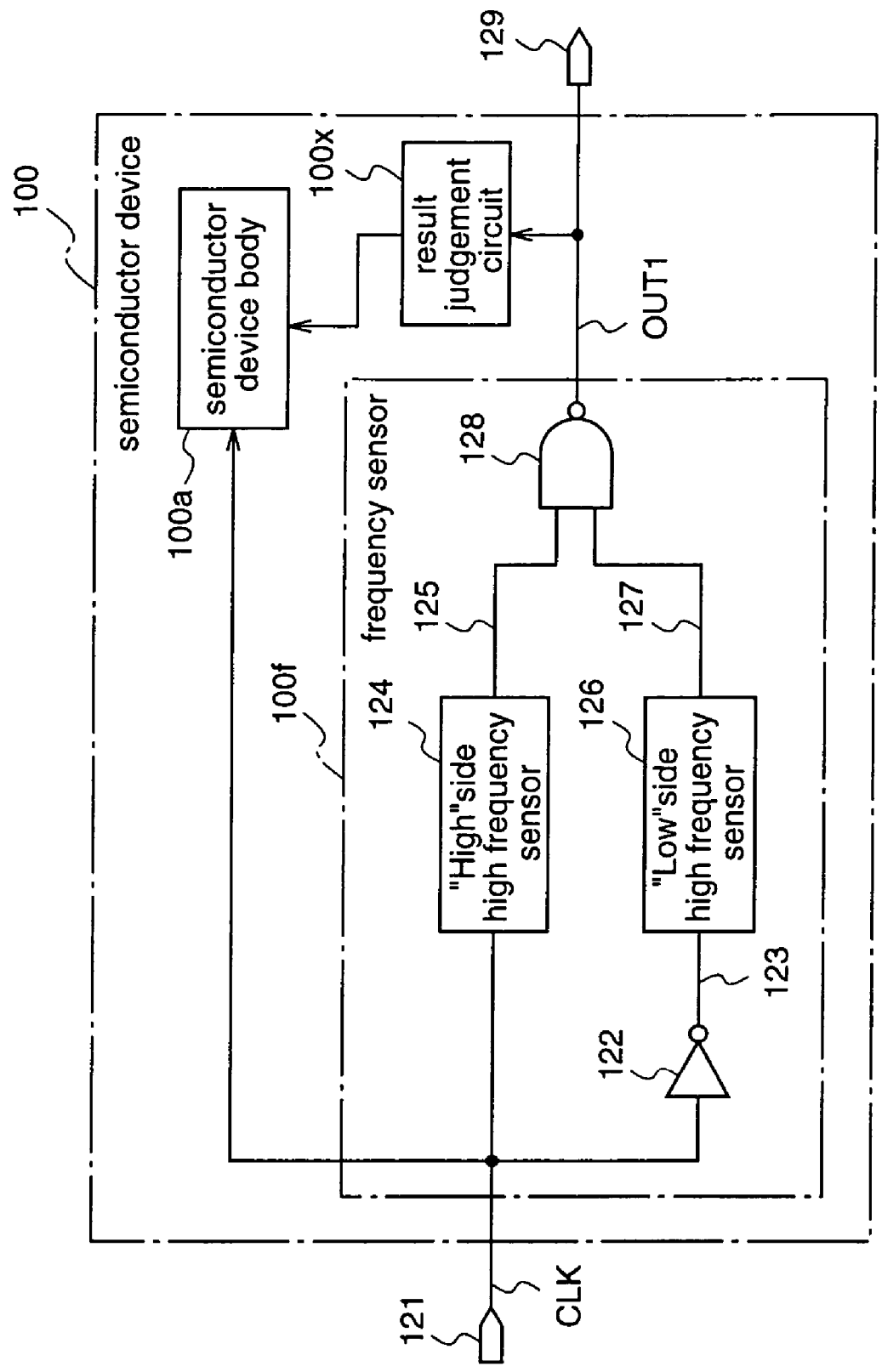
FIG. 12(a) is a diagram illustrating a semiconductor device having a frequency sensor according to a sixth embodiment of the present invention.
Figure 12B:
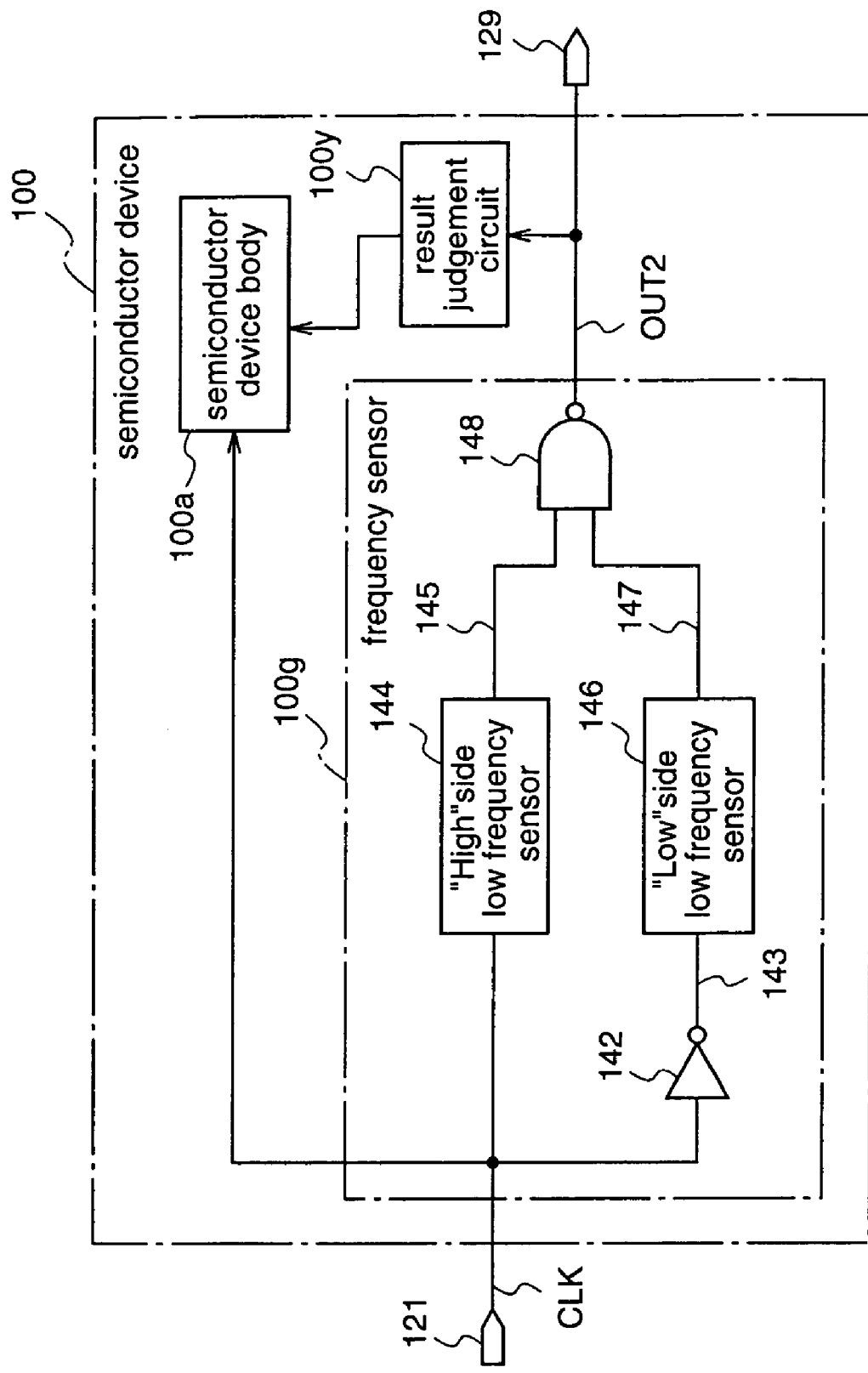
FIG. 12(b) is a diagram illustrating a semiconductor device having a frequency sensor according to the sixth embodiment of the present invention.

FIGS. 12(a) and 12(b) are diagrams illustrating a semiconductor device containing a frequency sensor according to a sixth embodiment of the present invention.

In FIG. 12(a), a semiconductor device 100 includes a semiconductor device body 100a, a frequency sensor 100f, and a result judgment circuit 100x.

The frequency sensor 100f includes a "High" side high frequency sensor 124, a "Low" side high frequency sensor 126, an inverter 122, and an NAND gate 128.

A clock signal input terminal 121 is a terminal for inputting a clock signal CLK to the semiconductor device 100 for which security is required, such as an IC card. A high frequency detection signal output terminal 129 is a terminal for outputting a high frequency detection signal OUT1 outputted from the frequency sensor 100e. The clock input signal CLK is inputted to the "High" side high frequency sensor 124 and the inverter 122. The inverter 122 inverts the clock signal CLK and outputs a clock inversion signal 123 to the "Low" side high frequency sensor 126. The "High" side high frequency sensor 124 outputs a "High" side high frequency detection signal 125 while the "Low" side high frequency sensor 126 outputs a "Low" side high frequency detection signal 127. The NAND gate 128 outputs a NAND of the "High" side high frequency detection signal 125 and the "Low" side high frequency detection signal 127, as a high frequency detection signal OUT1.

Hereinafter, a description will be given of the operation of the frequency sensor of the sixth embodiment constituted as described above.

The "High" side high frequency sensor 124 has the same construction as the frequency sensor 100b according to the first embodiment, and outputs "Low" indicating "abnormal" as the "High" side high frequency detection signal 125 when the clock input signal CLK is a high frequency signal with a "High" period being shorter than an allowable range.

The "Low" side high frequency sensor 126 also has the same construction as the frequency sensor 100b according to the first embodiment, and outputs "Low" indicating "abnormal" as the "Low" side high frequency detection signal 127 when the clock inversion signal 123 is a high frequency signal with a "High" period (i.e., a "Low" period of the clock signal CLK) being shorter than an allowable range.

When "Low" indicating "abnormal" is outputted as either the "High" side high frequency detection signal 125 or the "Low" side high frequency detection signal 127, the NAND gate 128 outputs "High" indicating "abnormal" as the high frequency detection signal OUT1.

As described above, the frequency sensor according to the sixth embodiment is able to perform high frequency abnormality detection in both the "High",period and the "Low" period of the clock signal CLK.

Further, in the semiconductor device according to the sixth embodiment, when the high frequency abnormal detection signal is outputted, the result judgment circuit 100x judges this signal, and resets the semiconductor device body, or stops the operation thereof, or deletes/destroys the data for which security is required, whereby a high-security semiconductor device can be realized.

As shown in FIG. 12(b), when the "High" side high frequency sensor and the "Low" side high frequency sensor are constituted as a "High" side low frequency sensor 144 and a "Low" side low frequency sensor 146 that are identical to the frequency sensor 100c of the second embodiment, respectively, it is possible to perform low frequency abnormality detection in both the "High" period and the "Low" period of the clock input signal.

Further, in the semiconductor device shown in FIG. 12(b), when the low frequency abnormal detection signal is outputted, the result judgment circuit 100y judges this signal, and resets the semiconductor device body, or stops the operation thereof, or deletes/destroys the data for which security is required, whereby a high-security semiconductor device is realized.

Embodiment 7

Figure 13:
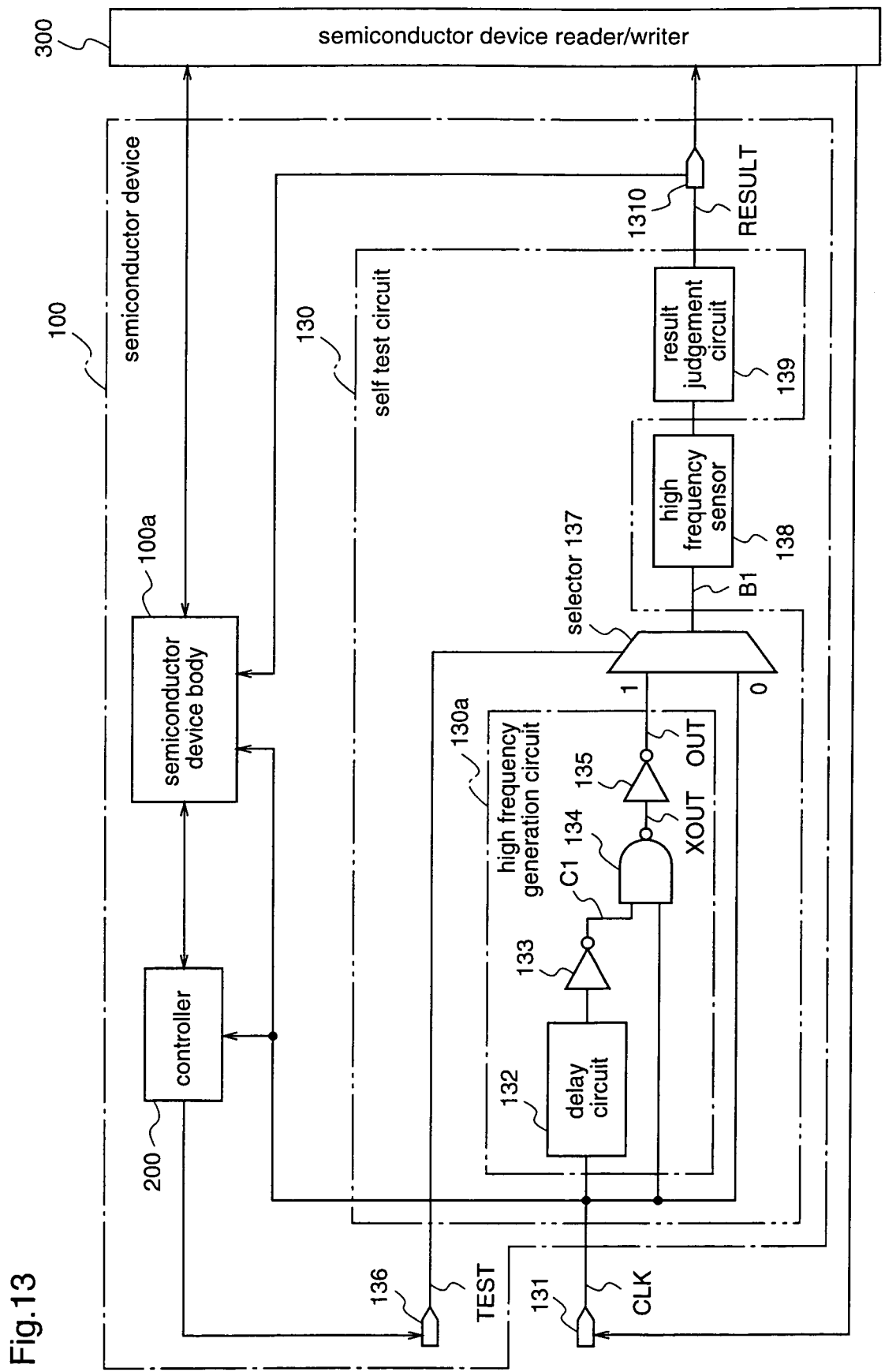
FIG. 13 is a diagram illustrating a frequency sensor according to a seventh embodiment of the present invention.
Figure 14:
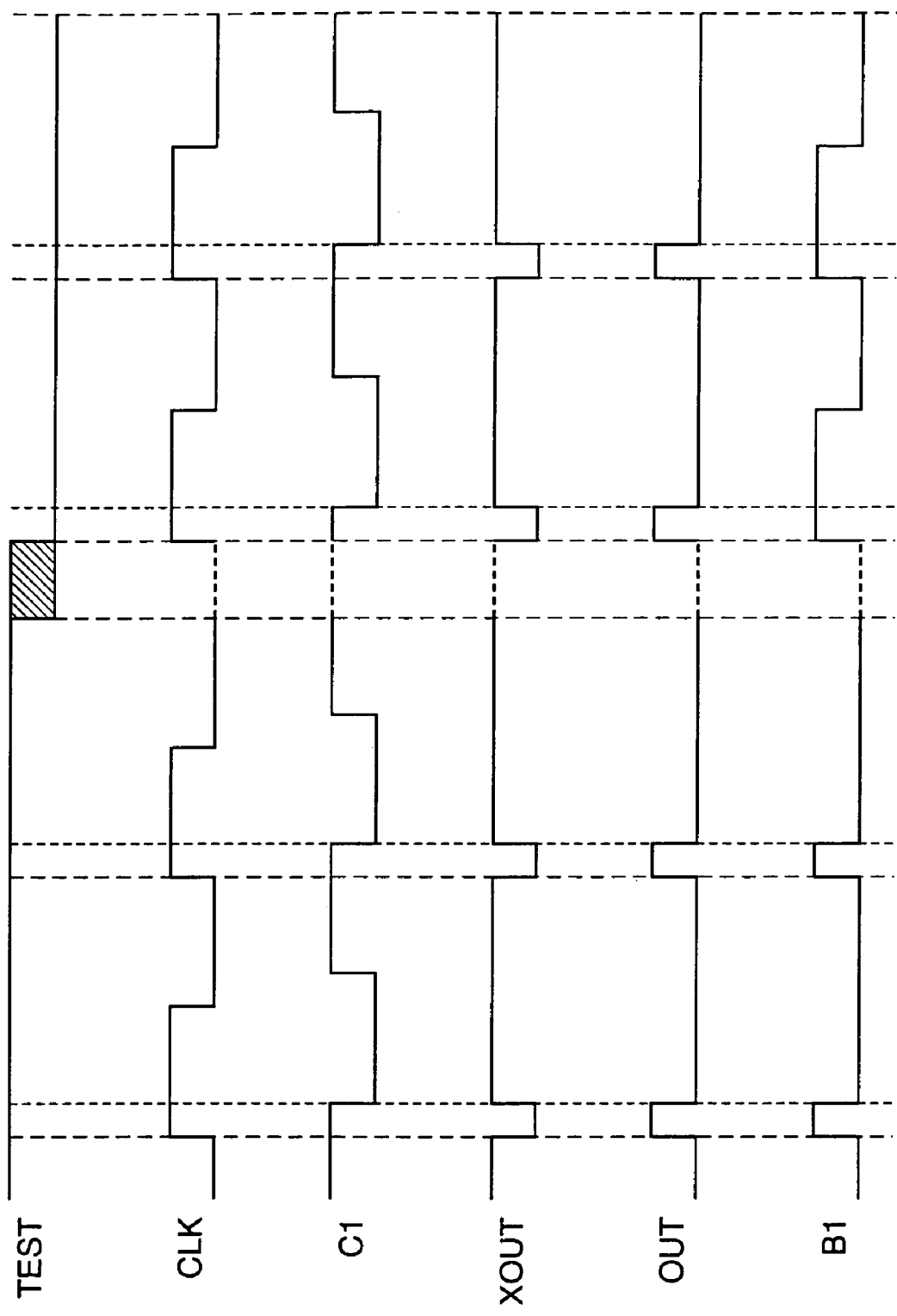
FIG. 14 is a diagram illustrating signal timings of the frequency sensor according to the seventh embodiment of the present invention.

FIGS. 13 and 14 are diagrams illustrating a semiconductor device according to a seventh embodiment of the present invention.

In FIG. 13, a semiconductor device 100 includes a semiconductor device body 100a, a high frequency sensor 138, a self-test circuit 130, and a controller 200.

The high frequency sensor has the same construction as that of the first, third, or fifth embodiment.

The self-test circuit 130 includes a high frequency generation circuit 130a, a selector 137 as a switching unit, and a result judgment circuit 139.

The high frequency generation circuit 130a includes a delay circuit 132 for delaying a clock signal CLK inputted through a clock signal input terminal 131, an inverter 133 for inverting an output signal of the delay circuit 132, a NAND gate 134 to which an output signal C1 of the inverter 133 and the clock signal CLK are inputted, and an inverter 135 for inverting an output signal XOUT of the NAND gate 134.

The selector 137 selects either the clock signal CLK or the output signal OUT of the high frequency generation circuit 130a, according to a self test mode signal TEST inputted through a self test mode signal input terminal 136. The high frequency sensor 138 receives an output signal B1 of the selector. The result judgment circuit 139 applies its output signal RESULT to a judgment signal output terminal 1310 and the semiconductor device body 100a.

The controller 200 is controlled by the semiconductor device body 100a, and generates a self test mode signal TEST. The clock signal CLK is supplied to the semiconductor device body 100a and the controller 200.

A semiconductor device reader/writer 300 supplies a clock signal to the semiconductor device 100, and exchanges data with the semiconductor device 100.

Hereinafter, a description will be given of the operation of the frequency sensor according to the seventh embodiment that is constituted as described above.

When executing a self test, "High" is outputted from the controller 200 as a self test mode signal TEST. At this time, a signal OUT is outputted from the selector 137. The signal OUT is an inversion signal of an AND XOUT between the clock signal CLK and a signal C1 that is obtained by delaying the clock signal CLK and then inverting the delayed signal. The frequency of this output signal OUT is higher than the allowable frequencies of the high frequency sensor 138, that is, the "High" period of the output signal OUT is short. Therefore, when the output signal OUT is inputted to the high frequency sensor 138, the sensor 138 outputs a signal indicating "abnormal" to the result judgment circuit 139 when the sensor itself operates normally. On the other hand, when the sensor itself is out or order, the sensor 138 outputs a signal indicating "normal". Thereby, the result judgment circuit 139 outputs a judgment signal RESULT indicating "normal" or "abnormal".

At this time, the controller 200 notifies the semiconductor device body 100a that "High" is outputted as a self test mode signal TEST, and the semiconductor device body 100a informs this to the semiconductor device reader/writer 300 together with the output signal of the result judgment circuit 139 indicating "abnormal". As described above, since "abnormal" or "normal" in the test mode means its reverse, the semiconductor device reader/writer 300 informs that the high frequency sensor 138 of the semiconductor device 100 is "normal" by displaying characters on a display or the like (not shown), when the semiconductor device 100 is in the self test mode and "abnormal" is informed from the result judgment circuit 139. Conversely, when the result judgment circuit 139 indicates "normal" in the self test mode, the semiconductor device reader/writer 300 informs that the high frequency sensor 138 is out of order, by character display or the like.

When no self test is executed, "Low" is outputted as a self test mode signal TEST. The selector 137 outputs a clock signal CLK, whereby the clock signal CLK to be used in the normal operation mode is inputted to the high frequency sensor 130, and a result corresponding to the clock signal CLK is outputted from the result judgment circuit 139.

In this case, as described for the first embodiment, when "Low" indicating "abnormal" is outputted from the high frequency sensor 138 to the result judgment circuit 139 during the normal operation, the result judgment circuit 139 judges this signal, and outputs a control signal as a judgment signal RESULT to the semiconductor device body 100a, which control signal resets the semiconductor device body 100a, or stops the operation thereof, or deletes/destroys the data.

As described above, according to the seventh embodiment, in addition to the effects of the first, third, and fifth embodiments, the frequency sensor can perform self diagnosis as to whether the frequency sensor itself is normal or out of order, by the delay circuit 132 that generates a frequency higher than the allowed frequencies. Thereby, it is possible to provide a highly reliable frequency sensor or a semiconductor device containing the frequency sensor.

Embodiment 8

Figure 15:
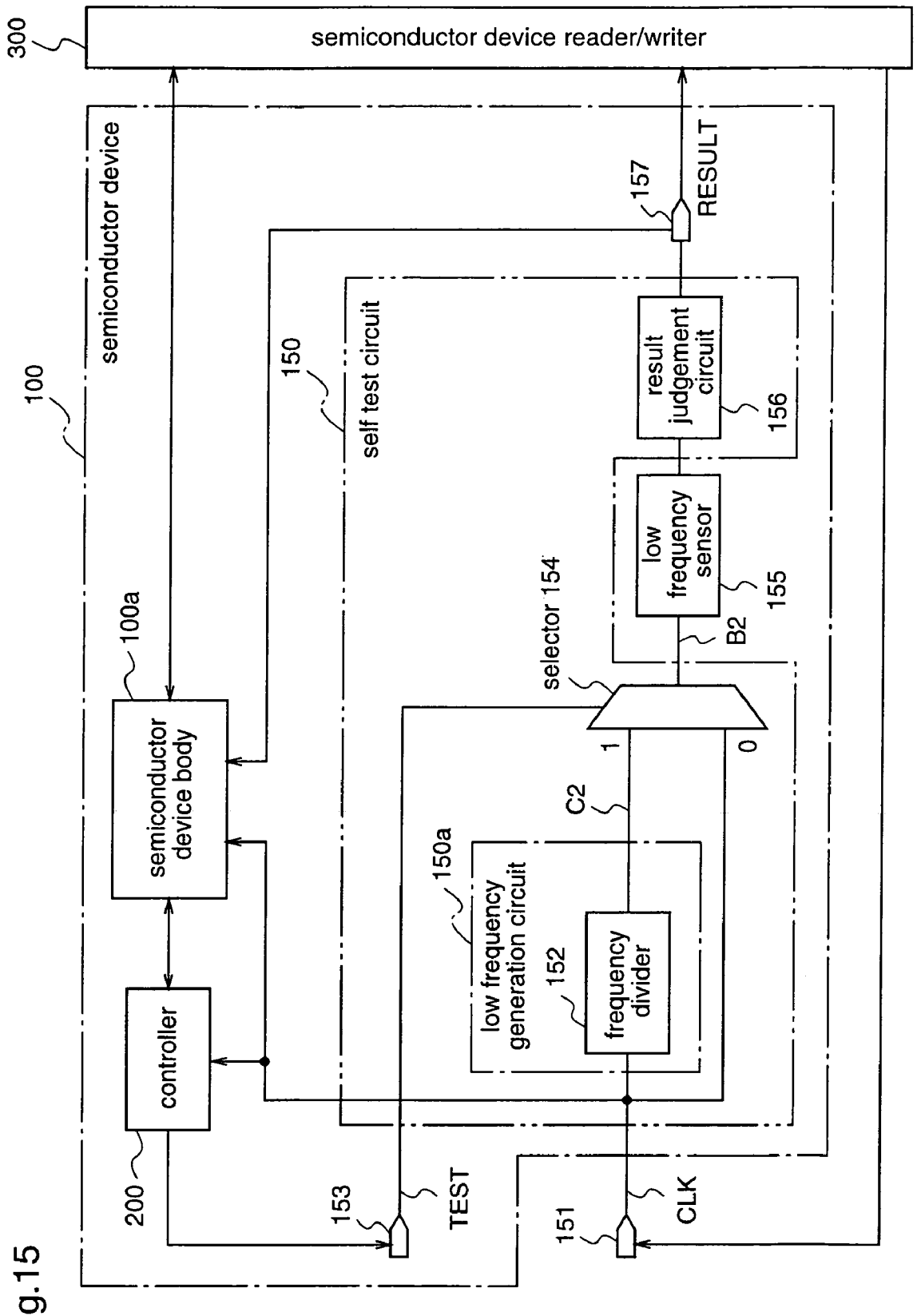
FIG. 15 is a diagram illustrating a frequency sensor according to an eighth embodiment of the present invention.
Figure 16:
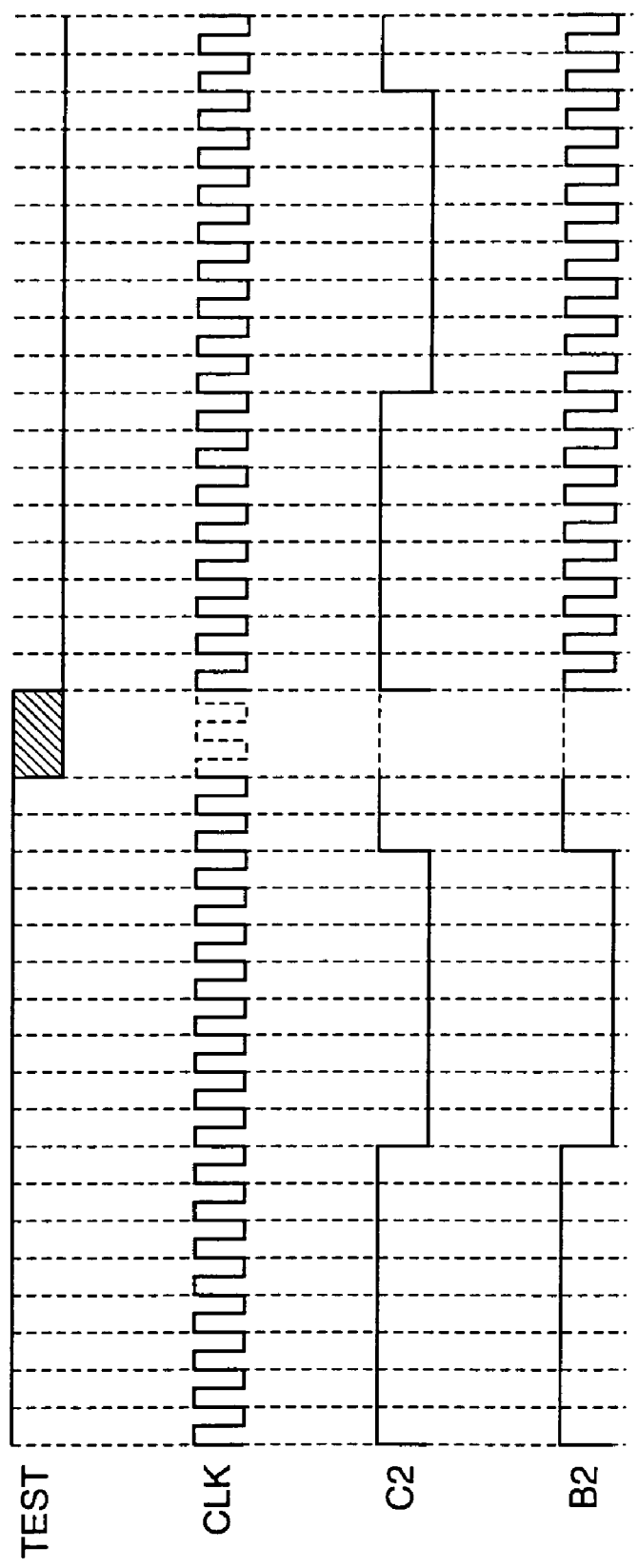
FIG. 16 is a diagram illustrating signal timings of the frequency sensor according to the eighth embodiment of the present invention.
Figure 17:
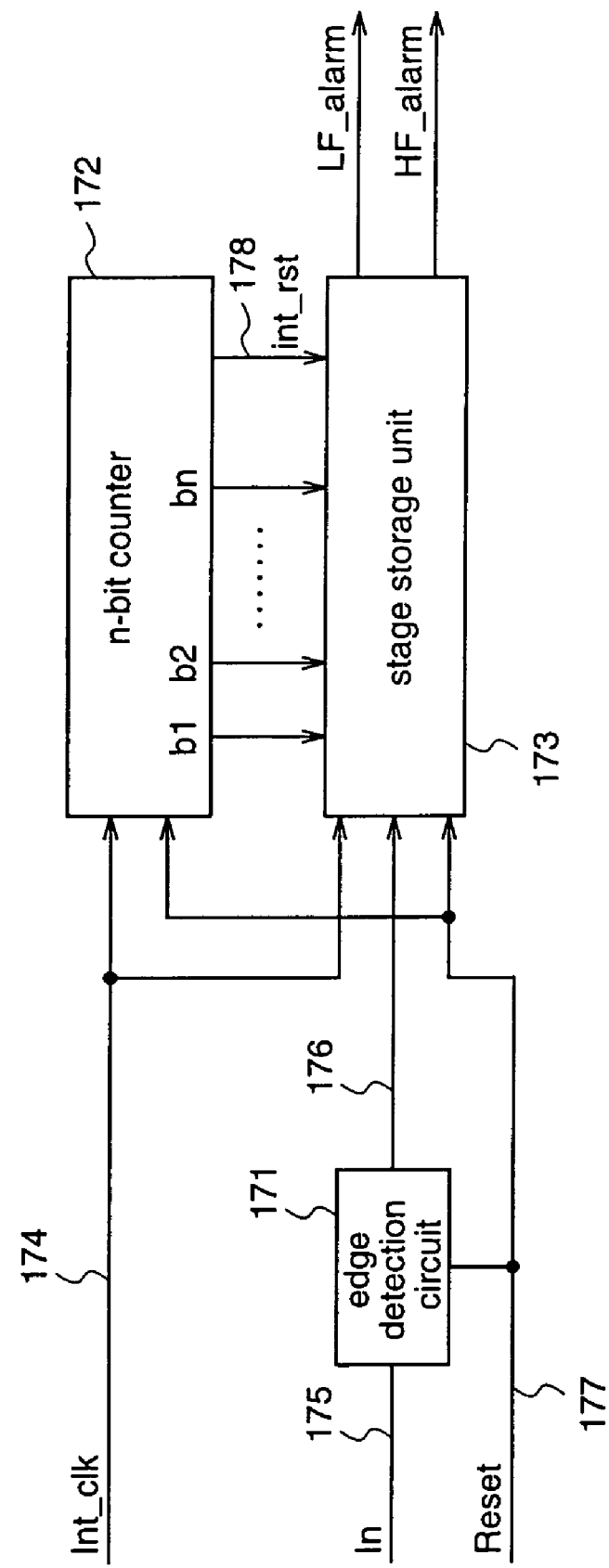
FIG. 17 is a diagram illustrating a conventional frequency sensor.
Figure 18:
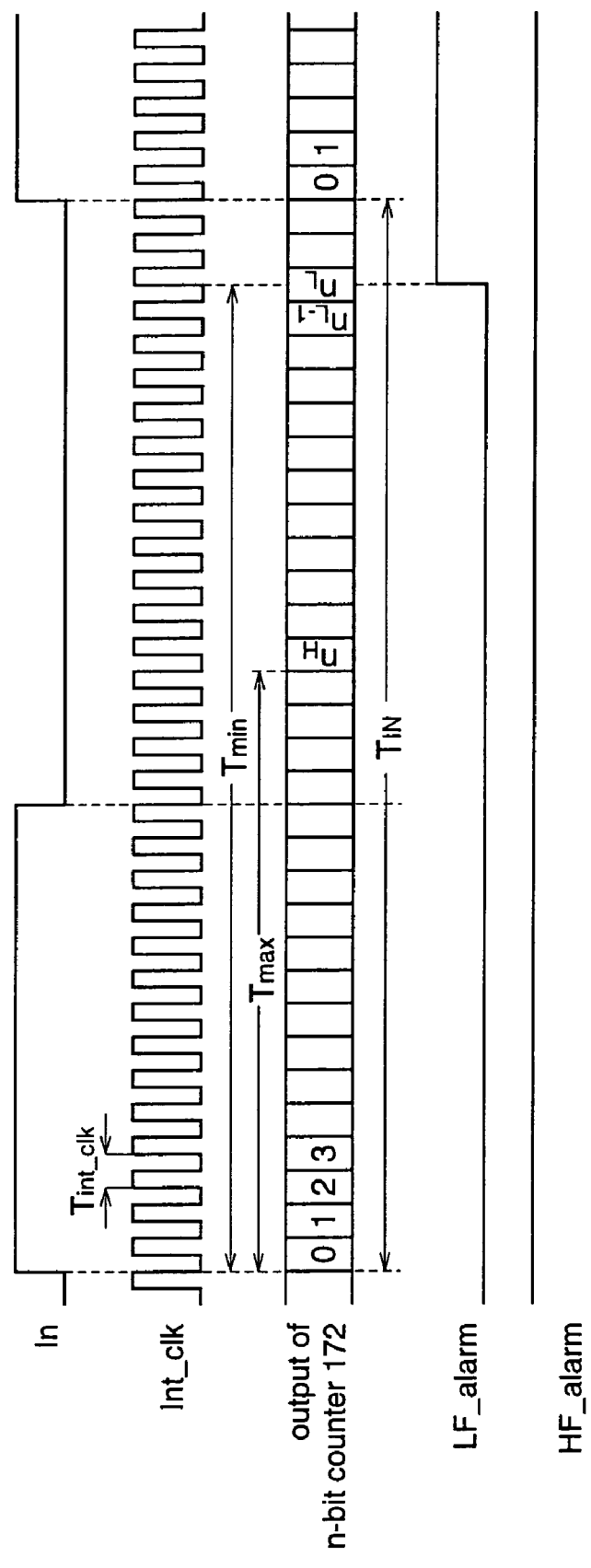
FIG. 18 is a diagram illustrating signal timings of the conventional frequency sensor.

FIGS. 15 and 16 are diagrams illustrating a frequency sensor according to an eighth embodiment of the present invention.

The frequency sensor according to the eighth embodiment is provided with a low frequency sensor 155 and a low frequency generation circuit 150a instead of the high frequency sensor 138 and the high frequency generation circuit 130a of the seventh embodiment.

The low frequency sensor has the same construction as those of the second, fourth, and sixth embodiments.

A frequency division circuit 152 divides the frequency of a clock signal 151 so as to be detected by the low frequency sensor 155.

The block structure of this eighth embodiment is identical to that of the seventh embodiment.

Hereinafter, a description will be given of the operation of the frequency sensor according to the eighth embodiment constituted as described above.

The operation according to the eighth embodiment is identical to the operation according to the seventh embodiment. That is, when executing a self test, "High" is outputted from the controller 200 as a self test mode signal TEST. At this time, a clock signal CLK that is frequency-divided by the frequency division circuit 152 is outputted from the selector 154. This output signal is inputted to the low frequency sensor 155, and a signal indicating "abnormal" is outputted to the result judgment circuit 156 when the sensor itself operates normally. On the other hand, when the sensor itself is out of order, a signal indicating "normal" is outputted. Thereby, a judgment signal RESULT indicating "normal" or "abnormal" is outputted from the result judgment circuit 156. The semiconductor device reader/writer 300 indicates whether the frequency sensor is normal or out of order, according to the judgment signal RESULT as well as the signal indicating the test mode, which is outputted from the semiconductor device body 100a.

Further, when no self test is executed, "Low" is outputted as a self test mode signal TEST, and a clock signal CLK is outputted from the selector 154. Thereby, the clock signal to be used is inputted to the low frequency sensor 155 during the normal operation, and a result corresponding to the clock signal is outputted from the result judgment circuit 156.

In this case, as described for the second embodiment, when "Low" indicating "abnormal" is outputted to the result judgment circuit 156 by the low frequency sensor 155 during the normal operation, the result judgment circuit 156 judges this signal, and outputs a control signal as a judgment signal RESULT to the semiconductor device body 100a, which control signal resets the semiconductor device body 100a, or stops the operation thereof, or deletes/destroys the data.

As described above, the frequency sensor according to the eighth embodiment can perform self diagnosis as to whether the low frequency sensor itself is normal or out of order, by the frequency-division circuit 152 that generates a frequency lower than the allowed frequencies, in addition to the effects of the second, fourth, and sixth embodiments. Thereby, it is possible to provide a highly reliable frequency sensor or a semiconductor device including the frequency sensor.

While in the first to third embodiments the changes in the voltages at the points A1 and A2 are accelerated by the second conductivity type third MOS transistor and the inverter, the second conductivity type third MOS transistor and the inverter may be dispensed with.

While in the third to fifth embodiments the resistor block is constituted by connecting the switch-attached resistor elements in series and the capacitor block is constituted by connecting the switch-attached capacitors in parallel, these blocks may be constituted by other circuit networks.

While in the first to eighth embodiments the input clock signal is directly applied to the frequency sensor and the semiconductor device body, the input clock signal that is frequency-multiplied or frequency-divided may be inputted to one or both of the frequency sensor and the semiconductor device body when an increase in the power consumption is in an inconspicuous range.

While in the first to eighth embodiments the frequency sensor is contained in the semiconductor device, the frequency sensor may be externally attached.

While in the first to eighth embodiments the semiconductor device is an IC card or a LSI, it may be another semiconductor device so long as confidentiality is required of the stored or written data.

While in the fifth embodiment each of the resistor block and the capacitor block generates its switch selection signal by using a special nonvolatile memory and a special decoder, the switch selection signals may be generated by using a common nonvolatile memory and a common decoder.

The nonvolatile memory and the decoder may be included in any of the semiconductor device body, the frequency sensor, and the self test circuit, and further, they may be provided outside the semiconductor device such as the semiconductor device reader/writer.

While in the seventh and eighth embodiments only one of the high-frequency generation circuit and the low frequency generation circuit is provided in the self test circuit, both of these circuits may be provided in the self test circuit.

Further, the high frequency generation circuit and the low frequency generation circuit may have constructions other than those described for the seventh and eighth embodiments.

While in the seventh and eighth embodiments the self test mode signal TEST is generated by the controller 200, the self test mode signal TEST may be generated by a unit other than the controller 200, such as the semiconductor device body 100a.

Further, while the semiconductor device reader/writer is described as an example of an external device connected to the semiconductor device, the external device may be another device such as an ATM or an automatic ticket checker.

While in the first to eighth embodiments inputting or outputting of the clock signal CLK, the self test mode signal TEST, the high frequency detection signal OUT1, the low frequency detection signal OUT2, and the judgment signal RESULT is performed through terminals, it may be performed through nodes instead of the terminals.

These terminals and nodes may be disposed at the periphery of the IC chip of the semiconductor device, or they may be pins protruding from the package that protects the semiconductor device.

Further, while the frequency sensor is provided in the semiconductor device, it may be provided outside the semiconductor device.

APPLICABILITY IN INDUSTRY

As described above, a frequency sensor and a semiconductor device according to the present invention is suitable for use to improve security of data that requires confidentiality, such as an IC card.

The invention claimed is:

1. A frequency sensor including:
a first conductivity type MOS transistor having a gate to which an input clock signal is applied, and a source connected to a first power supply voltage;
a second conductivity type MOS transistor having a gate to which the input clock signal is applied, and a source connected to a second power supply voltage;
a resistor connected between drains of said first and second MOS transistors; and
a capacitor connected between the drain of said first MOS transistor and said second power supply voltage;
an inverter having an input terminal connected to a connection node of said capacitor and said resistor; and
a third conductivity type MOS transistor having a gate connected to an output terminal of said inverter, a drain connected to the input terminal of said inverter, and a source connected to the second power supply voltage;
wherein a frequency of the input clock signal is detected by an output signal of the inverter.

2. A frequency sensor as defined in claim 1 wherein a resistor block comprising switch-attached resistors is provided instead of said resistor, each switch-attached resistor including a switch for switching each corresponding resistor between an enable state and a disable state.

3. A frequency sensor as defined in claim 1 wherein a capacitor block comprising switch-attached capacitors is provided instead of said capacitor, each switch-attached capacitor including a switch for switching each corresponding capacitor between an enable state and a disable state.

4. A frequency sensor as defined in claim 2 wherein the switch comprises a fuse.

5. A frequency sensor as defined in claim 3 wherein the switch comprises a fuse.

6. A frequency sensor as defined in claim 2 wherein ON/OFF of the switch is set according to data stored in a nonvolatile memory.

7. A frequency sensor as defined in claim 3 wherein ON/OFF of the switch is set according to data stored in a nonvolatile memory.

8. A frequency sensor as defined in claim 1 wherein the clock signal is applied as an inversion signal of the clock signal.

9. A frequency sensor as defined in claim 1 further including a self-diagnosis unit for checking whether the frequency sensor operates normally or not.

10. A frequency sensor as defined in claim 9 wherein said self-diagnosis unit comprises:
a high frequency generation circuit that generates a high frequency from the input clock signal, which is provided in said self-diagnosis unit;
a switching unit that switches a signal to be inputted to the frequency sensor between the input clock signal and a high frequency clock signal that is outputted from said high frequency generation circuit; and
a judgement circuit that detects a signal detected by the frequency sensor to judge whether the frequency sensor operates normally or not.

11. A frequency sensor as defined in claim 9 wherein said self-diagnosis unit comprises:
a low frequency generation circuit that generates a low frequency from the input clock signal, which is provided in said self-diagnosis unit;
a switching unit that switches a signal to be inputted to the frequency sensor between the input clock signal and a low frequency clock signal that is outputted from said low frequency generation circuit; and
a judgement circuit that detects a signal detected by the frequency sensor to judge whether the frequency sensor operates normally or not.

12. A semiconductor device comprising:
a frequency sensor, said frequency sensor including:
a first conductivity type MOS transistor having a gate to which an input clock signal is applied, and a source connected to a first power supply voltage;
a second conductivity type MOS transistor having a gate to which the input clock signal is applied, and a source connected to a second power supply voltage;
a resistor connected between drains of said first and second MOS transistors; and
a capacitor connected between the drain of said first MOS transistor and said second power supply voltage;
an inverter having an input terminal connected to a connection node of said capacitor and said resistor; and
a third conductivity type MOS transistor having a gate connected to an output terminal of said inverter, a drain connected to the input terminal of said inverter, and a source connected to the second power supply voltage, wherein a frequency of the input clock signal is detected by an output signal of the inverter; and
a semiconductor device body to which the input clock signal is applied, the operation of which is controlled according to a signal detected by the frequency sensor.

13. A semiconductor device as defined in claim 12 wherein said semiconductor device body is reset by the detected signal.

14. A semiconductor device as defined in claim 12 wherein said semiconductor device body stops its operation according to the detected signal.

15. A semiconductor device as defined in claim 12 wherein said semiconductor device body deletes or destroys the stored data for which confidentiality is required, according to the detected signal.

* * * * *